United States Patent
Medoff

(10) Patent No.: US 9,587,349 B2
(45) Date of Patent: Mar. 7, 2017

(54) TEXTILES AND METHODS AND SYSTEMS FOR PRODUCING TEXTILES

(71) Applicant: XYLECO, INC., Woburn, MA (US)

(72) Inventor: Marshall Medoff, Brookline, MA (US)

(73) Assignee: XYLECO, INC., Wakefield, MA (US)

( * ) Notice: Subject to any disclaimer, the term of this patent is extended or adjusted under 35 U.S.C. 154(b) by 0 days.

(21) Appl. No.: 14/557,170

(22) Filed: Dec. 1, 2014

(65) Prior Publication Data

US 2015/0082556 A1 Mar. 26, 2015

Related U.S. Application Data

(63) Continuation of application No. 12/417,731, filed on Apr. 3, 2009, now Pat. No. 8,911,833.

(60) Provisional application No. 61/049,394, filed on Apr. 30, 2008, provisional application No. 61/073,436, filed on Jun. 18, 2008.

(51) Int. Cl.
| | |
|---|---|
| *D04H 1/42* | (2012.01) |
| *D04H 1/425* | (2012.01) |
| *D03D 15/00* | (2006.01) |
| *H01J 37/317* | (2006.01) |
| *B01J 19/08* | (2006.01) |
| *D06M 10/00* | (2006.01) |
| *D06M 10/02* | (2006.01) |
| *D06M 10/08* | (2006.01) |
| *D06M 101/04* | (2006.01) |
| *D06M 101/06* | (2006.01) |

(52) U.S. Cl.
CPC ........... *D06M 10/008* (2013.01); *B01J 19/08* (2013.01); *D03D 15/00* (2013.01); *D04H 1/42* (2013.01); *D04H 1/425* (2013.01); *D06M 10/001* (2013.01); *D06M 10/02* (2013.01); *D06M 10/08* (2013.01); *H01J 37/317* (2013.01); *B01J 2219/08* (2013.01); *D06M 2101/04* (2013.01); *D06M 2101/06* (2013.01); *D10B 2201/00* (2013.01); *D10B 2201/01* (2013.01); *D10B 2201/22* (2013.01); *D10B 2201/26* (2013.01); *D10B 2201/28* (2013.01); *H01J 2237/303* (2013.01); *Y10T 156/10* (2015.01)

(58) Field of Classification Search
CPC .. D06M 10/008; D06M 10/001; D06M 10/02; D06M 10/08; D06M 2101/04; D06M 2101/06; H01J 37/317; H01J 2237/303; B01J 19/08; B01J 2219/08; D04H 1/42; D04H 1/425; D03D 15/00; D10B 2201/00; D10B 2201/01; D10B 2201/22; D10B 2201/26; Y10T 156/10

See application file for complete search history.

(56) References Cited

U.S. PATENT DOCUMENTS

| | | | |
|---|---|---|---|
| 2,087,263 A | 7/1937 | Olsen | |
| 3,254,939 A | 6/1966 | Munzel | |
| 3,414,498 A * | 12/1968 | Nagai et al. | 522/70 |
| 3,502,426 A * | 3/1970 | Schenkel et al. | 8/116.1 |
| 4,041,192 A * | 8/1977 | Heger et al. | 427/492 |
| 4,138,298 A * | 2/1979 | Bobeth | D06M 14/26 28/163 |
| 4,146,417 A | 3/1979 | Drelich et al. | |
| 4,277,242 A | 7/1981 | McLaren | |
| 4,382,847 A | 5/1983 | Akesson et al. | |
| 4,486,585 A | 12/1984 | Turunen et al. | |
| 4,896,041 A | 1/1990 | Vlasbloem et al. | |
| 6,183,865 B1 | 2/2001 | Yabuki et al. | |
| 2007/0031664 A1* | 2/2007 | Kuwano et al. | 428/364 |
| 2009/0283229 A1* | 11/2009 | Medoff | 162/50 |
| 2009/0321026 A1 | 12/2009 | Medoff | |

FOREIGN PATENT DOCUMENTS

GB 1316458 * 5/1973

OTHER PUBLICATIONS

Gomzova et al., Derwent Abstract, 1987-057107, 1987.
Pan, "Radiation Initiated Croslinking of Cellulose", Polymer Letters, vol. 7, pp. 419-425, 1969.
PCT International Search Report for PCT/US2009/041901, Korean Intellectual Property Office, Dec. 17, 2009, 4 pages.
PCT Written Opinion of the ISA for PCT/US2009/041901, Korean Intellectual Property Office, Dec. 17, 2009, 5 pages.
Takacs et al., "Effect of Gamma-Irradiation on Cotton-Cellulose," Radiation Physics and Chemistry, 1999, vol. 55, pp. 663-666.
Iller, E. et al., "Electron-Beam Stimulation of the Reactivity of Cellulose Pulps for Production of Derivatives", Radiation Physics and Chemistry, vol. 63, 2002, pp. 253-257.
Kato, K. et al., "Surface Oxidation of Cellulose Fibers by Vacuum Ultraviolet Irradiation", Department of Chemical Science and Engineering, Faculty of Engineering, Kobe University, Japan, 1998, pp. 357-361.
Stepanik, T.M. et al., "Electron Treatment of Wood Pulp for the Viscose Process", Radiation Physics and Chemistry, vol. 57, 2000, pp. 377-379.

* cited by examiner

*Primary Examiner* — Amina Khan
(74) *Attorney, Agent, or Firm* — Leber IP Law

(57) ABSTRACT

Textiles are provided that include fibrous cellulosic materials having an α-cellulose content of less than about 93%, the fibrous materials being spun, woven, knitted, or entangled. The fibrous cellulosic materials can be irradiated with a dose of ionizing radiation that is sufficient to increase the molecular weight of the cellulosic materials without causing significant depolymerization of the cellulosic materials. Methods of treating textiles that include irradiating the textiles are also provided.

14 Claims, 11 Drawing Sheets

TEXTILES AND METHODS AND SYSTEMS FOR PRODUCING TEXTILES

RELATED APPLICATIONS

This application is a continuation application of U.S. patent application Ser. No. 12/417,731, filed Apr. 3, 2009, which claims priority to U.S. Provisional Application Ser. Nos. 61/049,394, filed Apr. 30, 2008, and to 61/073,436, filed Jun. 18, 2008. The complete disclosure of each of these applications is hereby incorporated by reference herein.

TECHNICAL FIELD

This invention relates to textiles and methods and systems for producing textiles.

BACKGROUND

Cellulosic and lignocellulosic fibers (referred to collectively herein as "cellulosic fibers") have long been used to form textiles. Textiles are flexible materials formed from fibers, e.g., filaments, staple fibers, and/or yarns. Textiles are formed by a wide variety of processes, including weaving, knitting, crocheting, entanglement, and pressing of fibers together (felting). Types of textiles include woven and knitted fabrics, nonwovens, scrims, and the like. Cellulosic textiles include, for example, textiles formed from cotton, rayon, flax, jute, hemp, ramie, and other natural plant materials.

Textiles are used in a wide variety of applications, requiring many different properties. For example, textile properties include resistance to pilling, tactile characteristics such as hand, tear resistance, thermal insulating characteristics, stain and wrinkle resistance, and the like.

SUMMARY

Many embodiments of this application use Natural Force™ Chemistry. Natural Force™ Chemistry methods use the controlled application and manipulation of physical forces, such as particle beams, gravity, light, etc., to create intended structural and chemical molecular change. In preferred implementations, Natural Force™ Chemistry methods alter molecular structure without chemicals or microorganisms. By applying the processes of Nature, new useful matter can be created without harmful environmental interference.

The invention is based, at least in part, on the discovery that irradiating cellulosic or lignocellulosic materials, for example cellulosic fibers, with an appropriate dose of ionizing radiation favorably affects the physical properties of the materials, for example by increasing the molecular weight and level of crosslinking of at least a cellulosic portion of the irradiated material. As a result, the mechanical and/or other properties of textiles containing cellulosic materials can be favorably altered. For example, the tear resistance, pill resistance, charge density, wettability, bend recovery, and other properties of cellulosic fiber containing textiles can be increased by irradiating with ionizing radiation.

In one aspect, the invention features textiles including one or more fibrous cellulosic materials having an α-cellulose content of less than about 93%, the fibrous materials being spun, woven, knitted, or entangled. The fibrous cellulosic materials are irradiated, e.g., with an electron beam or other source of ionizing radiation, with a dose of ionizing radiation that is sufficient to increase the molecular weight of the cellulosic material without causing significant depolymerization of the cellulosic material.

In another aspect, the invention features an irradiated textile that has a molecular weight greater than an identical textile in unradiated form (i.e., subjected only to naturally-occurring levels of radiation). In various examples, the molecular weight of the irradiated textile is 10%, 25%, 50%, 75%, 100%, 150%, 200%, 300%, or as much as 500% greater than the molecular weight of the textile in unradiated form.

Some implementations include one or more of the following features. The textiles can include yarns or fabrics. The α-cellulose content can be less than about 80%. The fibrous cellulosic materials can be selected from the group consisting of flax, hemp, jute, abaca, sisal, banana fiber, coconut fiber, wheat straw, LF, ramie, bamboo fibers, cuprammonium cellulose, regenerated wood cellulose, lyocell, cellulose acetate, and blends thereof. Other useful fibers include fibers made from corn or other starch- or protein-containing plant or vegetable materials such as soy, milk-based fibers, and chitin fibers made from, e.g., shrimp or crab shells. The fibrous cellulosic materials can have a lignin content of at least 2%. The fibrous cellulosic materials can be irradiated prior to, during, or after being spun, woven, knitted, or entangled.

In another aspect, the invention features methods of treating a textile including irradiating a textile including a fibrous cellulosic material having a first molecular weight with ionizing electron beam radiation, and controlling the dose of ionizing radiation so as to provide an irradiated textile including a second fibrous cellulosic material having a second molecular weight higher than the first molecular weight.

Some implementations include any of the above features, and/or one or more of the following features. The dose of ionizing radiation can be at least 0.10 MRad, e.g., the dose of ionizing radiation can be controlled to a level of about 0.25 to about 2.5 MRad. Electrons in the electron beams can have an energy of at least 0.25 MeV, e.g., from about 0.25 MeV to about 7.5 MeV. The methods can further include quenching the irradiated textiles, in some cases in the presence of a gas selected to react with radicals present in the irradiated textiles. The fibrous cellulosic materials can include cotton.

In another aspect, the invention features methods of treating textiles including irradiating textiles including one or more fibrous cellulosic materials having a first molecular weight, and having an α-cellulose content of less than about 93%, with ionizing radiation, and controlling the dose of ionizing radiation so as to provide irradiated textiles including a second fibrous cellulosic material having a second molecular weight higher than the first molecular weight.

Some implementations of this aspect include one or more of the following features. The dose of ionizing radiation can be at least 0.10 MRad, e.g., the dose of ionizing radiation is controlled to a level of about 0.25 to about 2.5 MRad. The ionizing radiation can include an electron beam and electrons in the electron beam can have an energy of at least 0.25 MeV, e.g., from about 0.25 MeV to about 7.5 MeV. The methods can further include quenching the irradiated textile, in some cases in the presence of a gas selected to react with radicals present in the irradiated textile. The textiles can include a yarn or a fabric. The fibrous cellulosic or ligno-cellulosic materials can be selected from the group consisting of flax, hemp, jute, abaca, sisal, wheat straw, LF, ramie, bamboo fibers, cuprammonium cellulose, regenerated wood cellulose, lyocell, algae, seaweed, cellulose acetate, and blends of any of the above materials, as well as other materials described herein. The textile can also include blends of these and other cellulosic and lignocellulosic materials with synthetic materials, e.g., polyethylene and other polymers.

In another aspect, the invention features forming a garment from a textile material comprising a cellulosic material, and treating the garment with a particle beam of sufficient energy to penetrate the textile material. In some implementations, irradiation functionalizes the cellulosic material. The invention also features a garment comprising a garment body, configured to be worn by a user. The garment comprises a textile comprising a cellulosic material, the cellulosic material comprising a plurality of saccharide repeat units, the cellulosic material being functionalized with functional groups selected from the group consisting of aldehyde groups, enol groups, nitroso groups, nitrile groups, nitro groups, ketone groups, amino groups, alkyl amino groups, alkyl groups, chloroalkyl groups, chlorofluoroalkyl groups, and carboxylic acid groups. The cellulosic material has at least one functional group per 250 repeat units of saccharide, and may in some cases have at least one functional group per 50 repeat units or even per 2 units of saccharide.

In another aspect, the invention features a method that includes irradiating a textile material that has a lignin content of at least 2%.

In a further aspect, the invention features a method comprising irradiating a material that has been prepared by removing non-cellulosic portions of a lignocellulosic material. In some embodiments, the prepared material has a relatively high α-cellulose content, e.g., greater than 70%, greater than 80%, or greater than 90%. The invention also features products made in this manner.

The term "yarn," as used herein, refers to any long, continuous length of interlocked fibers, suitable for use in the production of textiles, sewing, crocheting, knitting, weaving, embroidery, and the like. The term "yarn" includes threads, which are a type of thin yarn which can be used, e.g., for sewing by hand or machine.

The term "fabric," as used herein, refers to any type of fabric, including woven materials, nonwoven materials, knitted or plaited materials, scrims, or any other type of materials formed from entangled fibers, filaments, and/or yarns.

The term "textile," as used herein, refers to fabrics, and also to fibers, filaments, and yarns.

The yarn, fabric, or textile can be coated or uncoated. For example, the yarn, fabric or textile can be coated with a sizing, e.g., a starch or starch derivative.

The full disclosures of each of the following U.S. patent applications, which are being filed concurrently herewith, are hereby incorporated by reference herein: U.S. application Ser. No. 12/417,707, now U.S. Pat. No. 7,867,358, issued on Jan. 11, 2011, U.S. application Ser. No. 12/417,720, now U.S. Pat. No. 7,846,295, issued on Dec. 7, 2010, U.S. patent application Ser. No. 12/417,699, now U.S. Pat. No. 7,931,784, issued on Apr. 26, 2011, U.S. application Ser. No. 12/417,840, now U.S. Pat. No. 8,236,535, issued on Aug. 7, 2012, U.S. application Ser. No. 12/417,900, U.S. application Ser. No. 12/417,880, now U.S. Pat. No. 8,212,087, issued on Jul. 3, 2012, U.S. application Ser. No. 12/417,723, U.S. application Ser. No. 12/417,786, now U.S. Pat. No. 8,025,098, issued on Sep. 27, 2011, U.S. application Ser. No. 12/417,904, now U.S. Pat. No. 7,867,359, issued on Jan. 11, 2011.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION

Figure 1:
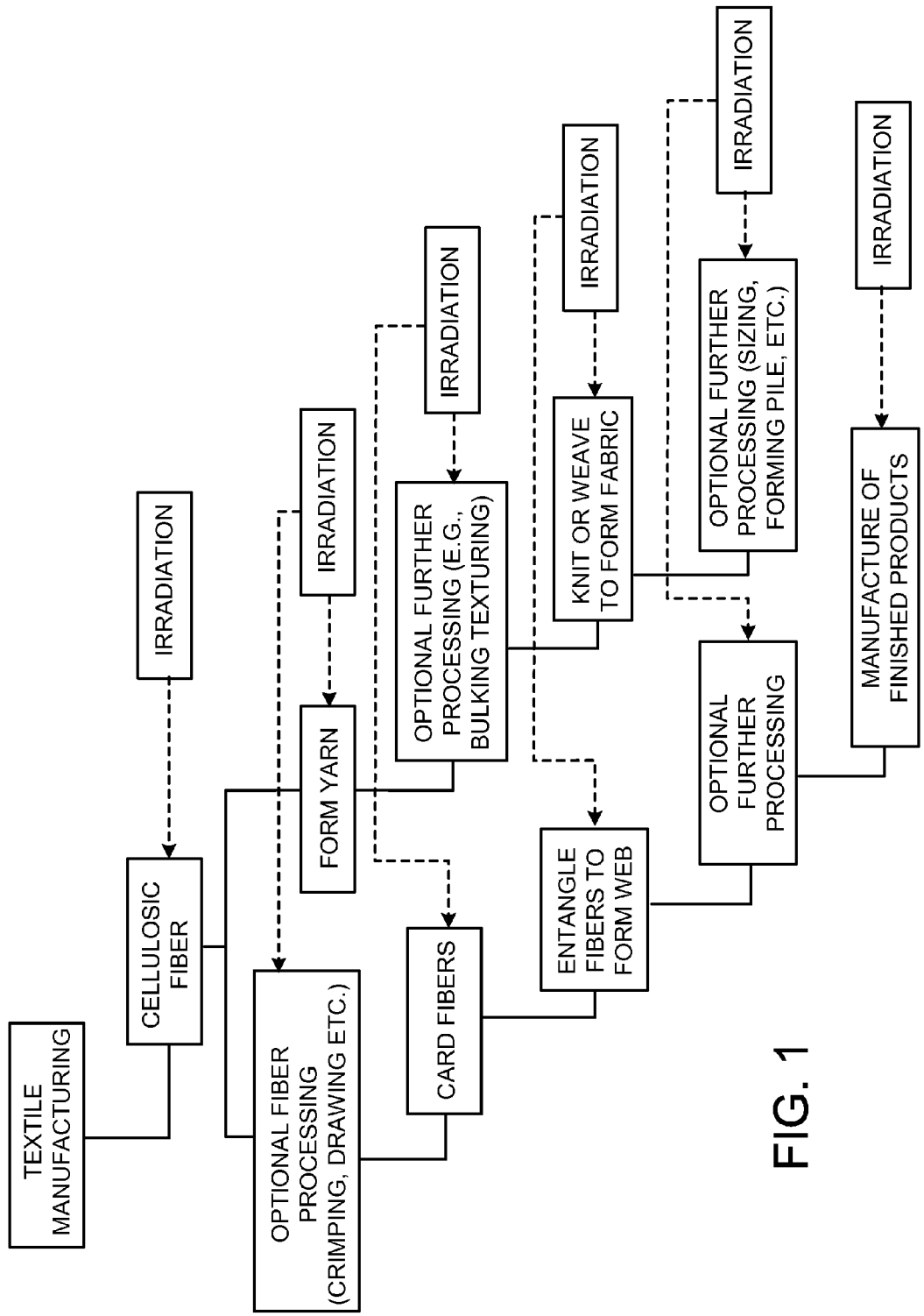
FIG. 1 is a diagrammatic view of a textile manufacturing system.
Figure 2:
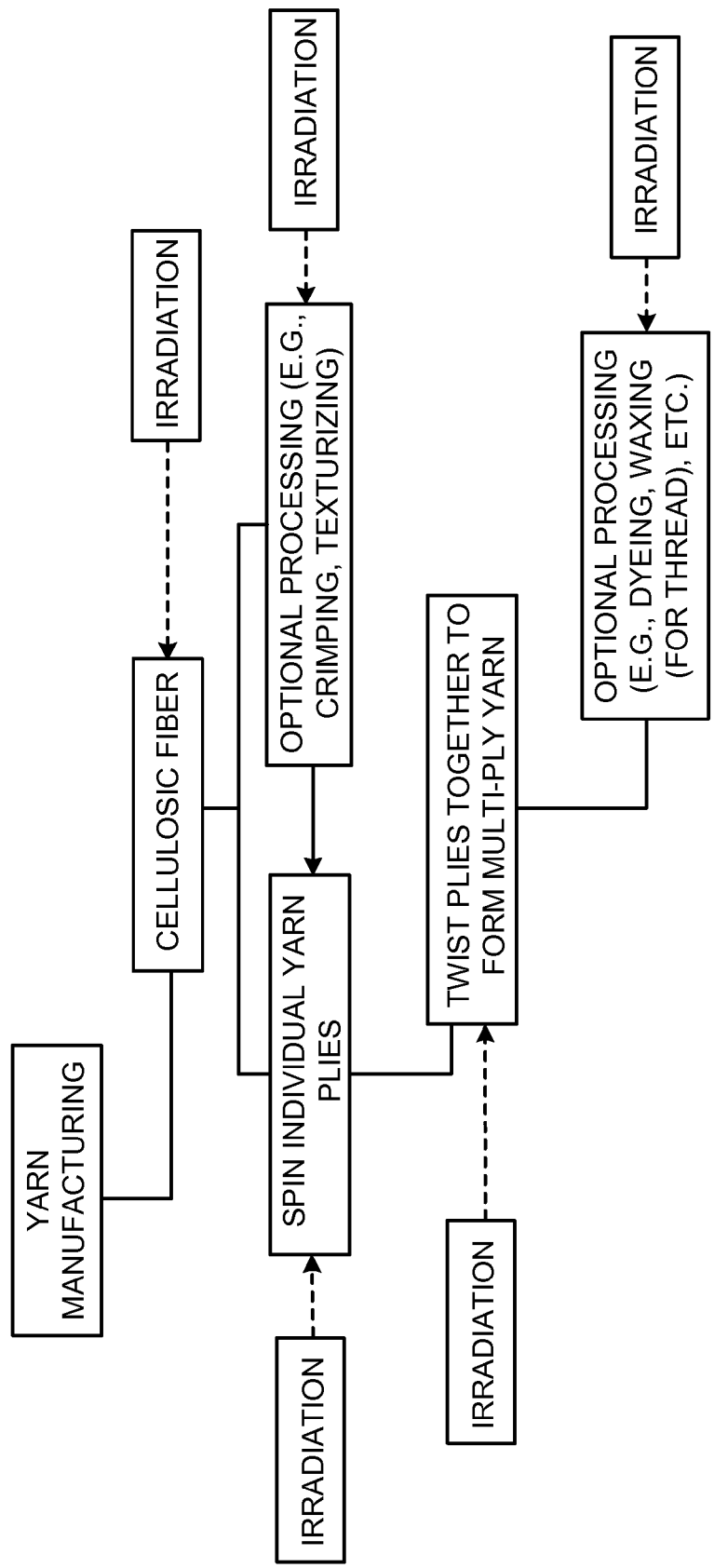
FIG. 2 is a diagrammatic view of a yarn manufacturing system.

As discussed herein, the invention is based, in part, on the discovery that by irradiating fibrous materials, i.e., cellulosic and lignocellulosic materials, at appropriate levels, the molecular structure of at least a cellulosic portion of the fibrous material can be changed. For example, the change in molecular structure can include a change in any one or more of an average molecular weight, average crystallinity, surface area, polymerization, porosity, branching, grafting, and domain size of the cellulosic portion. These changes in molecular structure can in turn result in favorable alterations of the physical characteristics exhibited by the fibrous materials. Moreover, the functional groups of the fibrous material can be favorably altered.

Various cellulosic and lignocellulosic materials, their uses, and applications have been described in U.S. Pat. Nos. 7,307,108, 7,074,918, 6,448,307, 6,258,876, 6,207,729, 5,973,035 and 5,952,105; and in various patent applications, including "FIBROUS MATERIALS AND COMPOSITES," PCT/US2006/010648, filed on Mar. 23, 2006, and "FIBROUS MATERIALS AND COMPOSITES," U.S. Patent Application Publication No. 2007/0045456. In addition, PCT/US2007/0227, filed on Oct. 26, 2007, describes various methods used to pretreat cellulosic and lignocellulosic biomass to create materials that can be used to prepare various products and co-products. Some of these pretreated materials can be used to produce starch-based fibers, e.g., polylactic acid fibers, e.g., from corn and other starch-containing plant and vegetable materials. The aforementioned documents are all incorporated herein by reference in their entireties.

In addition, fibers made from chitin can be used in the methods and products described herein. Chitin is a polysaccharide made from units of N-acetylglucosamine (more completely, N-acetyl-D-glucos-2-amine) that form covalent β-1,4 linkages (similar to the linkages between glucose units forming cellulose). Chitin is thus a type of cellulose with one hydroxyl group on each monomer substituted with an acetylamine group. This allows for increased hydrogen bonding between adjacent polymers, giving the chitin-polymer matrix increased strength. Chitin can be obtained, for example, from shrimp, lobster, crab, and insect shells.

Relatively low doses of radiation can crosslink, graft, or otherwise increase the molecular weight and the degree of crosslinking of a cellulosic or lignocellulosic material (e.g., cellulose) and other fibers described herein. In some embodiments, the starting number average molecular weight (prior to irradiation) of cellulosic fibers is from about 200,000 to about 3,200,000, e.g., from about 250,000 to about 1,000,000 or from about 250,000 to about 700,000. In some embodiments, the starting number average molecular weight (prior to irradiation) of cellulosic fibers is from about 20,000 to about 1,000,000, e.g., from about 25,000 to about 500,000. The number average molecular weight after irradiation is greater than the starting number average molecular weight, for example by at least about 10%, 25%, 50%, 75%, 100%, 150%, 200%, 300%, or as much as 500%. For example, if the starting number average molecular weight is in the range of about 20,000 to about 1,000,000, the number average molecular weight after irradiation is in some instances from about 40,000 to about 2,000,000.

As will be discussed in further detail below, the crosslinking, grafting, or otherwise increasing the molecular weight of a natural or synthetic cellulosic material can be performed in a controlled and predetermined manner to provide desired properties for a particular application, such as strength, by selecting the type or types of radiation employed and/or dose or doses of radiation applied.

The new methods can be used to favorably alter various selected properties of cellulosic fibers by applying ionizing radiation at selected times and in controlled doses.

Cellulosic and other fibers having increased molecular weight can be used in making yarns, and directly in the manufacture of textiles, e.g., as staple fibers or thread. Crosslinking, grafting, or otherwise increasing the molecular weight of a selected material can improve the thermal stability of the material relative to an untreated material. Increasing the thermal stability of the selected material can allow it to be processed at higher temperatures without degradation. In addition, treating the cellulosic material with radiation can sterilize the material, which should reduce the tendency of a fabric containing the fibers to promote the growth of fungus, mold, mildew, microorganisms, or the like.

Ionizing radiation can also be used to control the functionalization of the fibrous material.

Irradiating to Increase Molecular Weight

Ionizing radiation can be applied to increase the molecular weight of cellulosic fibers at any desired stage in textile manufacturing. Ionizing radiation can be applied to increase molecular weight, e.g., after formation of the fibers or filaments of which the textile will be comprised, during or after formation of yarns, and before, during, or after entanglement, knitting, or weaving of fibers to form the textile. Alternatively, or in addition, radiation can be applied, e.g., to the finished textile or to a product made with the textile, e.g., a garment. In some embodiments, radiation is applied at more than one point during the manufacturing process.

For example, referring to FIG. 1, radiation can be applied to cellulosic fibers during or after yarn formation or any optional processing of the fibers or yarn, e.g., crimping, drawing, bulking, or the like.

Radiation can also be applied during nonwoven formation steps, such as carding, entanglement, and other processing steps such as needling or application of binders, backings, etc. In the case of woven or knitted fabrics, radiation can be applied during or after knitting or weaving, and/or during or after any further processing such as napping, shearing, velouring, etc. For both nonwovens and knitted or woven fabrics, radiation can be applied to the finished textile or to an article manufactured from the textile, e.g., a garment. It is generally preferable that the fibers, yarn, or fabric be in a relatively dry state during irradiation. Without wishing to be bound to theory, it is believed that irradiating the material in a relatively dry state helps to prevent chain cleavage of the cellulosic material. For example, the moisture content can be less than about 7.5%, e.g., less than 5%, 4%, 3%, 2%, 1.5% or 1%. In some cases, the moisture content may be in the range of 2% to 6%.

As will be discussed in further detail below, radiation can be applied to the finished textile in a manner so as to favorably affect the functional groups present within and/or on the surface of the textile.

Irradiating to Affect Material Functional Groups

After treatment with one or more ionizing radiations, such as photonic radiation (e.g., X-rays or gamma-rays), e-beam radiation, or irradiation with particles heavier than electrons that are positively or negatively charged (e.g., protons or carbon ions), any of the carbohydrate-containing materials or mixtures described herein become ionized; that is, they include radicals at levels that are detectable, for example, with an electron spin resonance spectrometer. After ionization, any material that has been ionized can be quenched to reduce the level of radicals in the ionized material, e.g., such that the radicals are no longer detectable with the electron spin resonance spectrometer. For example, the radicals can be quenched by the application of a sufficient pressure to the ionized material and/or by contacting the ionized material with a fluid, such as a gas or liquid, that reacts with (quenches) the radicals. Various gases, for example nitrogen or oxygen, or liquids, can be used to at least aid in the quenching of the radicals and to functionalize the ionized material with desired functional groups. Thus, irradiation followed by quenching can be used to provide a material with desired functional groups, including for example one or more of the following: aldehyde groups, enol groups, nitroso groups, nitrile groups, nitro groups, ketone groups, amino groups, alkyl amino groups, alkyl groups, chloroalkyl groups, chlorofluoroalkyl groups, and/or carboxylic acid groups. These groups increase the hydrophilicity of the region of the material where they are present. In some implementations, the material is irradiated and quenched, before or after processing steps such as dyeing and sizing, to affect the functionality within and/or at the surface of the material and thereby affect properties of the material such as the receptivity of the material surface to sizes, dyes, coatings, and the like, and the adherence of sizes, dyes, coatings, and the like to the material.

Functionalization can also favorably change the charge density of the textile. This can be advantageous in certain applications, for example when the irradiated, charged fibers are used in filter materials such as air filters, e.g., HEPA filters, and cigarette filters. In the case of HEPA filters, the fibers are typically randomly deposited in a mat, while in the case of cigarette filters long fibers are typically arranged in a bundle or tow. When a particle moves through a mat or tow of charged fibers the particle touches the charged fibers. This causes the particle surface to become more polarized and to be attracted to the fiber surface. As a result, the particle will lose more speed (inertia) at each collision with a charged fiber. This can allow a filter having charged fibers to catch as many particles as a filter with a relatively higher fiber content but only uncharged particles. Fewer fibers in the filter can reduce cost and create a more open structure within the filter, decreasing resistance to airflow without reducing filter efficiency.

In some implementations, functionalization can enhance moisture regain (as measured according to ASTM D2495), e.g., the moisture regain of the textile can be increased by at least 5%, 10%, 25%, 50%, 100%, 250%, or 500% relative to untreated cellulosic material. This increase in moisture regain can be significant in enhancing wicking action, bend recovery, and resistance to static electricity.

Functionalization can also enhance the work recovery of cellulosic fibers (as measured according to ASTM D1774-94), e.g., by at least 5%, 10%, 25%, 50%, 100%, 250%, or 500% relative to untreated cellulosic material. The work recovery of the fibers can affect the wrinkle resistance of a fabric formed from the cellulosic material, with an increase in work recovery generally enhancing wrinkle resistance.

Functionalization can also increase the decomposition temperature of the cellulosic material or a textile formed from the cellulosic material, e.g., by at least 3, 5, or 25 degrees C. The decomposition temperature is measured by TGA in an air atmosphere, for example using IPC-TM-650 of the Institute for Interconnecting and Packaging Electronic Circuits, which references ASTM D 618 and D 3850.

Figure 3:
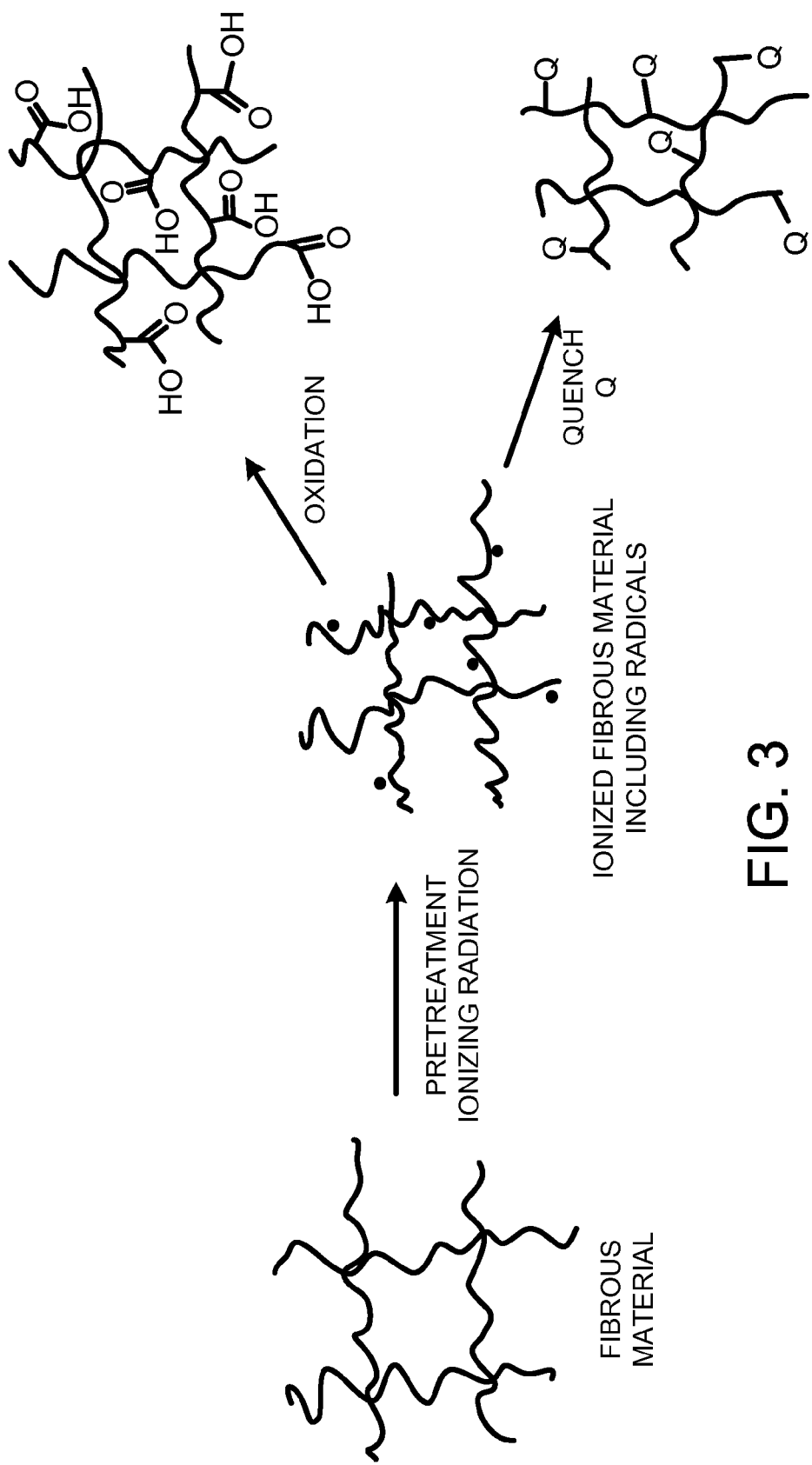
FIG. 3 is a diagrammatic illustration of changing a molecular and/or a supramolecular structure of a fibrous material.

FIG. 3 illustrates changing a molecular and/or a supramolecular structure of cellulosic fibers by treating the fibers with ionizing radiation, such as with electrons or ions of sufficient energy to ionize the material, to provide a first level of radicals. As shown in FIG. 3, if the ionized material remains in the atmosphere, it will be oxidized, e.g., to an extent that carboxylic acid groups are generated by reacting with the atmospheric oxygen. Since the radicals can "live" for some time after irradiation, e.g., longer than 1 day, 5 days, 30 days, 3 months, 6 months, or even longer than 1 year, material properties can continue to change over time, which in some instances can be undesirable. However, in some cases this can be desirable, for example in the case of filter materials. In filter materials the presence of radicals over a long period of time can provide extended filter life.

Detecting radicals in irradiated samples by electron spin resonance spectroscopy and radical lifetimes in such samples is discussed in Bartolotta et al., Physics in Medicine and Biology, 46 (2001), 461-471 and in Bartolotta et al., Radiation Protection Dosimetry, Vol. 84, Nos. 1-4, pp. 293-296 (1999). As shown in FIG. 3, the ionized material can be quenched to functionalize and/or to stabilize the ionized material.

In some embodiments, quenching includes an application of pressure to the ionized material, such as by mechanically deforming the material, e.g., directly mechanically compressing the material in one, two, or three dimensions, or applying pressure to a fluid in which the material is immersed, e.g., isostatic pressing. In such instances, the deformation of the material itself brings radicals, which are often trapped in crystalline domains, in close enough proximity so that the radicals can recombine, or react with another group. In some instances, the pressure is applied together with the application of heat, such as a sufficient quantity of heat to elevate the temperature of the material to above a melting point or softening point of a component of the ionized material, such as lignin, cellulose or hemicellulose. Heat can improve molecular mobility in the material, which can aid in the quenching of the radicals. When pressure is utilized to quench, the pressure can be greater than about 1000 psi, such as greater than about 1250 psi, 1450 psi, 3625 psi, 5075 psi, 7250 psi, 10000 psi, or even greater than 15000 psi.

In some embodiments, quenching includes contacting the ionized material with a fluid, such as a liquid or gas, e.g., a gas capable of reacting with the radicals, such as acetylene or a mixture of acetylene in nitrogen, ethylene, chlorinated ethylenes or chlorofluoroethylenes, propylene or mixtures of these gases. In other particular embodiments, quenching includes contacting the ionized material with a liquid, e.g., a liquid soluble in, or at least capable of penetrating into the ionized material and reacting with the radicals, such as a diene, such as 1,5-cyclooctadiene. In some specific embodiments, the quenching includes contacting the ionized material with an antioxidant, such as Vitamin E. If desired, the material can include an antioxidant dispersed therein, and the quenching can come from contacting the antioxidant dispersed in the material with the radicals.

Other methods for quenching are possible. For example, any method for quenching radicals in polymeric materials described in Muratoglu et al., U.S. Patent Application Publication No. 2008/0067724 and Muratoglu et al., U.S. Pat. No. 7,166,650, the disclosures of which are incorporated by reference herein in their entireties, can be utilized for quenching any ionized material described herein. Furthermore any quenching agent (described as a "sensitizing agent" in the above-noted Muratoglu disclosures) and/or any antioxidant described in either Muratoglu reference can be utilized to quench any ionized material.

Functionalization can be enhanced by utilizing heavy charged ions, such as any of the heavier ions described herein. For example, if it is desired to enhance oxidation, charged oxygen ions can be utilized for the irradiation. If nitrogen functional groups are desired, nitrogen ions or any ion that includes nitrogen can be utilized. Likewise, if sulfur or phosphorus groups are desired, sulfur or phosphorus ions can be used in the irradiation.

In some embodiments, after quenching any of the quenched ionized materials described herein can be further treated with one or more further doses of radiation, such as ionizing or non-ionizing radiation, sonication, pyrolysis, and oxidation for additional molecular and/or supramolecular structure change.

In some embodiments, the fibrous material is irradiated under a blanket of an inert gas, e.g., helium or argon, prior to quenching.

In some cases, the materials can be exposed to a particle beam in the presence of one or more additional fluids (e.g., gases and/or liquids). Exposure of a material to a particle beam in the presence of one or more additional fluids can increase the efficiency of the treatment.

In some embodiments, the material is exposed to a particle beam in the presence of a fluid such as air. Particles accelerated in any one or more of the types of accelerators disclosed herein (or another type of accelerator) are coupled out of the accelerator via an output port (e.g., a thin membrane such as a metal foil), pass through a volume of space occupied by the fluid, and are then incident on the material. In addition to directly treating the material, some of the particles generate additional chemical species by interacting with fluid particles (e.g., ions and/or radicals generated from various constituents of air, such as ozone and oxides of nitrogen). These generated chemical species can also interact with the material, and can act as initiators for a variety of different chemical bond-breaking reactions in the material. For example, any oxidant produced can oxidize the material, which can result in molecular weight reduction. In certain embodiments, additional fluids can be selectively introduced into the path of a particle beam before the beam is incident on the material. As discussed above, reactions between the particles of the beam and the particles of the introduced fluids can generate additional chemical species, which react with the material and can assist in functionalizing the material, and/or otherwise selectively altering certain properties of the material. The one or more additional fluids can be directed into the path of the beam from a supply tube, for example. The direction and flow rate of the fluid(s) that is/are introduced can be selected according to a desired exposure rate and/or direction to control the efficiency of the overall treatment, including effects that result from both particle-based treatment and effects that are due to the interaction of dynamically generated species from the introduced fluid with the material. In addition to air, exemplary fluids that can be introduced into the ion beam include oxygen, nitrogen, one or more noble gases, one or more halogens, and hydrogen.

The location of the functional groups can be controlled by, for example, selecting a particular type and dose of ionizing particles. For example, gamma radiation tends to affect the functionality of molecules within the material, while electron beam radiation tends to preferentially affect the functionality of molecules at the surface.

In some cases, functionalization of the material can occur simultaneously with irradiation, rather than as a result of a separate quenching step. In this case, the type of functional groups and degree of oxidation can be affected in various ways, for example by controlling the gas blanketing the material to be irradiated, through which the irradiating beam passes. Suitable gases include nitrogen, oxygen, air, ozone, nitrogen dioxide, sulfur dioxide, and chlorine.

In some embodiments, functionalization results in the formation of enol groups in the fibrous material. This can enhance the receptivity of the functionalized material to inks, dyes, sizes, coatings, and the like, and can provide grafting sites.

Cooling Irradiated Materials

During treatment of the materials discussed above with ionizing radiation, especially at high dose rates, such as at rates greater then 0.15 Mrad per second, e.g., 0.25 Mrad/s, 0.35 Mrad/s, 0.5 Mrad/s, 0.75 Mrad/s or even greater than 1 Mrad/sec, the materials can retain significant quantities of heat so that the temperature of the material becomes elevated. While higher temperatures can, in some embodiments, be advantageous, e.g., when a faster reaction rate is desired, it is advantageous to control the heating to retain control over the chemical reactions initiated by the ionizing radiation, such as crosslinking, chain scission and/or grafting, e.g., to maintain process control.

For example, in one method, the material is irradiated at a first temperature with ionizing radiation, such as photons, electrons or ions (e.g., singularly or multiply charged cations or anions), for a sufficient time and/or a sufficient dose to elevate the material to a second temperature higher than the first temperature. The irradiated material is then cooled to a third temperature below the second temperature. If desired, the cooled material can be treated one or more times with radiation, e.g., with ionizing radiation. If desired, cooling can be applied to the material after and/or during each radiation treatment.

Cooling can in some cases include contacting the material with a fluid, such as a gas, at a temperature below the first or second temperature, such as gaseous nitrogen at or about 77 K. Even water, such as water at a temperature below nominal room temperature (e.g., 25 degrees Celsius) can be utilized in some implementations.

Types of Radiation

The radiation can be provided by, e.g., 1) heavy charged particles, such as alpha particles, oxygen particles, or protons, 2) electrons, produced, for example, in beta decay or electron beam accelerators, or 3) electromagnetic radiation, for example, gamma rays, X rays, or ultraviolet rays. Different forms of radiation ionize the material via particular interactions, as determined by the energy of the radiation. The radiation may be in the form of a particle beam of elementary particles, e.g., electrons, protons, alpha particles, and the like. In some implementations, the particle beam has sufficient energy to penetrate the cross-section of the material that is being irradiated. In embodiments that use electrons, the electrons can have a speed of, for example, 0.5 c to 99.9 c. Heavier particles, e.g., protons, generally have a speed of less than 0.5 c. Because heavier particles typically have lower speeds, less shielding is generally required than is needed for electron beams.

Heavy charged particles primarily ionize matter via Coulomb scattering; furthermore, these interactions produce energetic electrons that can further ionize matter. Alpha particles are identical to the nucleus of a helium atom and are produced by the alpha decay of various radioactive nuclei, such as isotopes of bismuth, polonium, astatine, radon, francium, radium, several actinides, such as actinium, thorium, uranium, neptunium, curium, californium, americium, and plutonium.

Electrons interact via Coulomb scattering and bremsstrahlung radiation produced by changes in the velocity of electrons. Electrons can be produced by radioactive nuclei that undergo beta decay, such as isotopes of iodine, cesium, technetium, and iridium. Alternatively, an electron gun can be used as an electron source via thermionic emission.

Electromagnetic radiation interacts via three processes: photoelectric absorption, Compton scattering, and pair production. The dominating interaction is determined by the energy of the incident radiation and the atomic number of the material. The summation of interactions contributing to the absorbed radiation in cellulosic material can be expressed by the mass absorption coefficient.

Electromagnetic radiation is subclassified as gamma rays, x rays, ultraviolet rays, infrared rays, microwaves, or radiowaves, depending on its wavelength.

Figure 4:
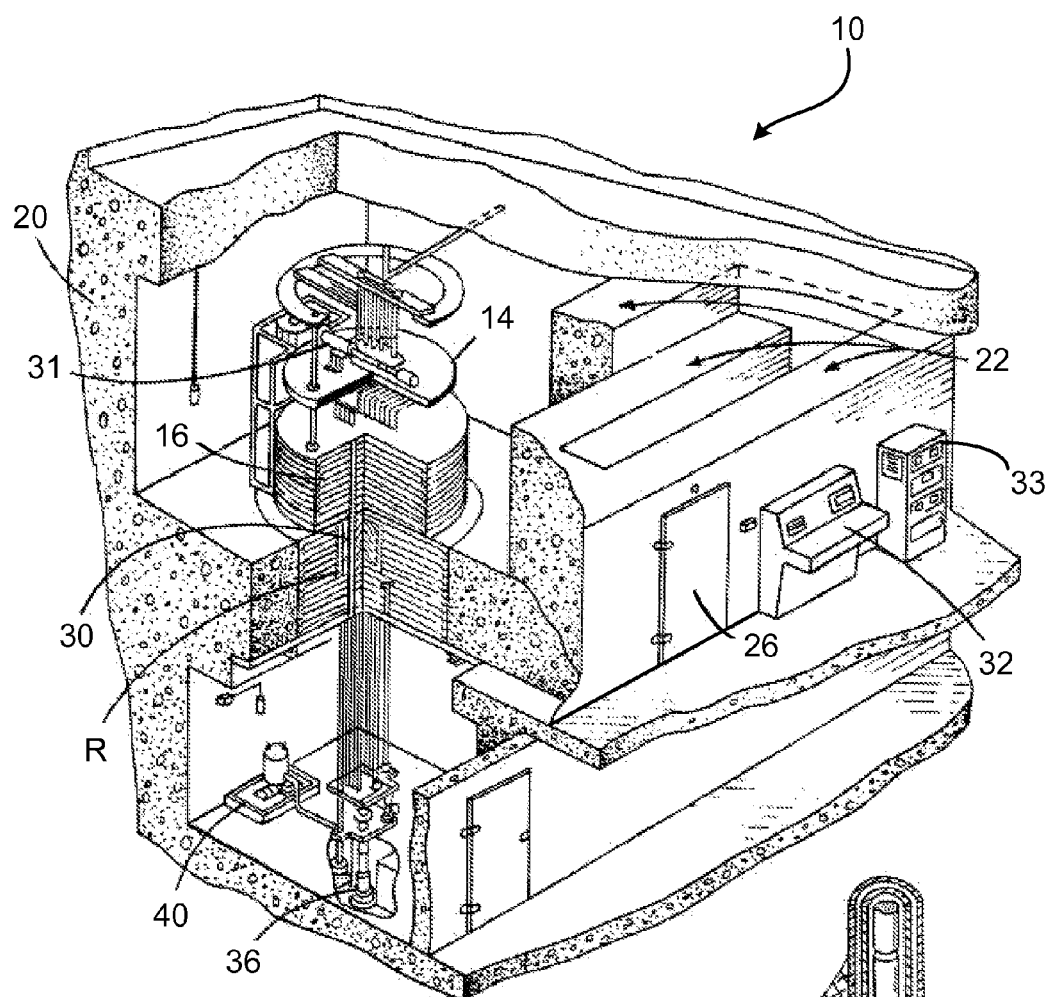
FIG. 4 is a perspective, cut-away view of a gamma irradiator housed in a concrete vault.
Figure 5:
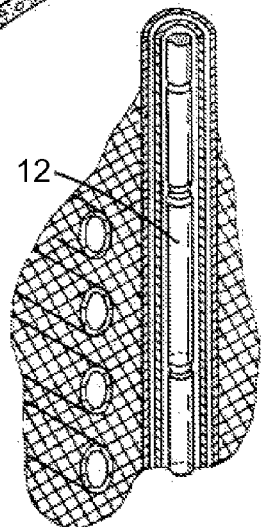
FIG. 5 is an enlarged perspective view of region R of FIG. 4.

For example, gamma radiation can be employed to irradiate the materials. Referring to FIGS. 4 and 5 (an enlarged view of region R), a gamma irradiator 10 includes gamma radiation sources 408, e.g., $^{60}$Co pellets, a working table 14 for holding the materials to be irradiated and storage 16, e.g., made of a plurality iron plates, all of which are housed in a concrete containment chamber (vault) 20 that includes a maze entranceway 22 beyond a lead-lined door 26. Storage 16 includes a plurality of channels 30, e.g., sixteen or more channels, allowing the gamma radiation sources to pass through storage on their way proximate the working table.

In operation, the sample to be irradiated is placed on a working table. The irradiator is configured to deliver the desired dose rate and monitoring equipment is connected to an experimental block 31. The operator then leaves the containment chamber, passing through the maze entranceway and through the lead-lined door. The operator mans a control panel 32, instructing a computer 33 to lift the radiation sources 12 into working position using cylinder 36 attached to a hydraulic pump 40.

Gamma radiation has the advantage of a significant penetration depth into a variety of materials in the sample. Sources of gamma rays include radioactive nuclei, such as isotopes of cobalt, calcium, technicium, chromium, gallium, indium, iodine, iron, krypton, samarium, selenium, sodium, thallium, and xenon.

Sources of x rays include electron beam collision with metal targets, such as tungsten or molybdenum or alloys, or compact light sources, such as those produced commercially by Lyncean.

Sources for ultraviolet radiation include deuterium or cadmium lamps.

Sources for infrared radiation include sapphire, zinc, or selenide window ceramic lamps.

Sources for microwaves include klystrons, Slevin type RF sources, or atom beam sources that employ hydrogen, oxygen, or nitrogen gases.

In some embodiments, a beam of electrons is used as the radiation source. A beam of electrons has the advantages of high dose rates (e.g., 1, 5, or even 10 Mrad per second), high throughput, less containment, and less confinement equipment. In addition, electrons having energies of 4-10 MeV can have a penetration depth of 5 to 30 mm or more, such as 40 mm.

Electron beams can be generated, e.g., by electrostatic generators, cascade generators, transformer generators, low energy accelerators with a scanning system, low energy accelerators with a linear cathode, linear accelerators, and pulsed accelerators. Electrons as an ionizing radiation source can be useful, e.g., for relatively thin materials, e.g., less than 0.5 inch, e.g., less than 0.4 inch, 0.3 inch, 0.2 inch, or less than 0.1 inch. In some embodiments, the energy of each electron of the electron beam is from about 0.25 MeV to about 7.5 MeV (million electron volts), e.g., from about 0.5 MeV to about 5.0 MeV, or from about 0.7 MeV to about 2.0 MeV. Electron beam irradiation devices may be procured commercially from Ion Beam Applications, Louvain-la-Neuve, Belgium or the Titan Corporation, San Diego, Calif. Typical electron energies can be 1, 2, 4.5, 7.5, or 10 MeV. Typical electron beam irradiation device power can be 1, 5, 10, 20, 50, 100, 250, or 500 kW. Typical doses can take values of 1, 5, 10, 20, 50, 100, or 200 kGy.

Tradeoffs in considering electron beam irradiation device power specifications include operating costs, capital costs, depreciation, and device footprint. Tradeoffs in considering exposure dose levels of electron beam irradiation would be energy costs and environment, safety, and health (ESH) concerns. Typically, generators are housed in a vault, e.g., of lead or concrete.

The electron beam irradiation device can produce either a fixed beam or a scanning beam. A scanning beam may be advantageous with large scan sweep length and high scan speeds, as this would effectively replace a large, fixed beam width. Further, available sweep widths of 0.5 m, 1 m, 2 m or more are available.

In embodiments in which the irradiating is performed with electromagnetic radiation, the electromagnetic radiation can have an energy per photon (in electron volts) of, for example, greater than $10^2$ eV, e.g., greater than $10^3$, $10^4$, $10^5$, $10^6$, or even greater than $10^7$ eV. In some embodiments, the electromagnetic radiation has energy per photon of between $10^4$ and $10^7$, e.g., between $10^5$ and $10^6$ eV. The electromagnetic radiation can have a frequency of, e.g., greater than $10^{16}$ hz, greater than $10^{17}$ hz, $10^{18}$, $10^{19}$, $10^{20}$, or even greater than $10^{21}$ hz. In some embodiments, the electromagnetic radiation has a frequency of between $10^{18}$ and $10^{22}$ Hz, e.g., between $10^{19}$ to $10^{21}$ Hz.

Figure 6:
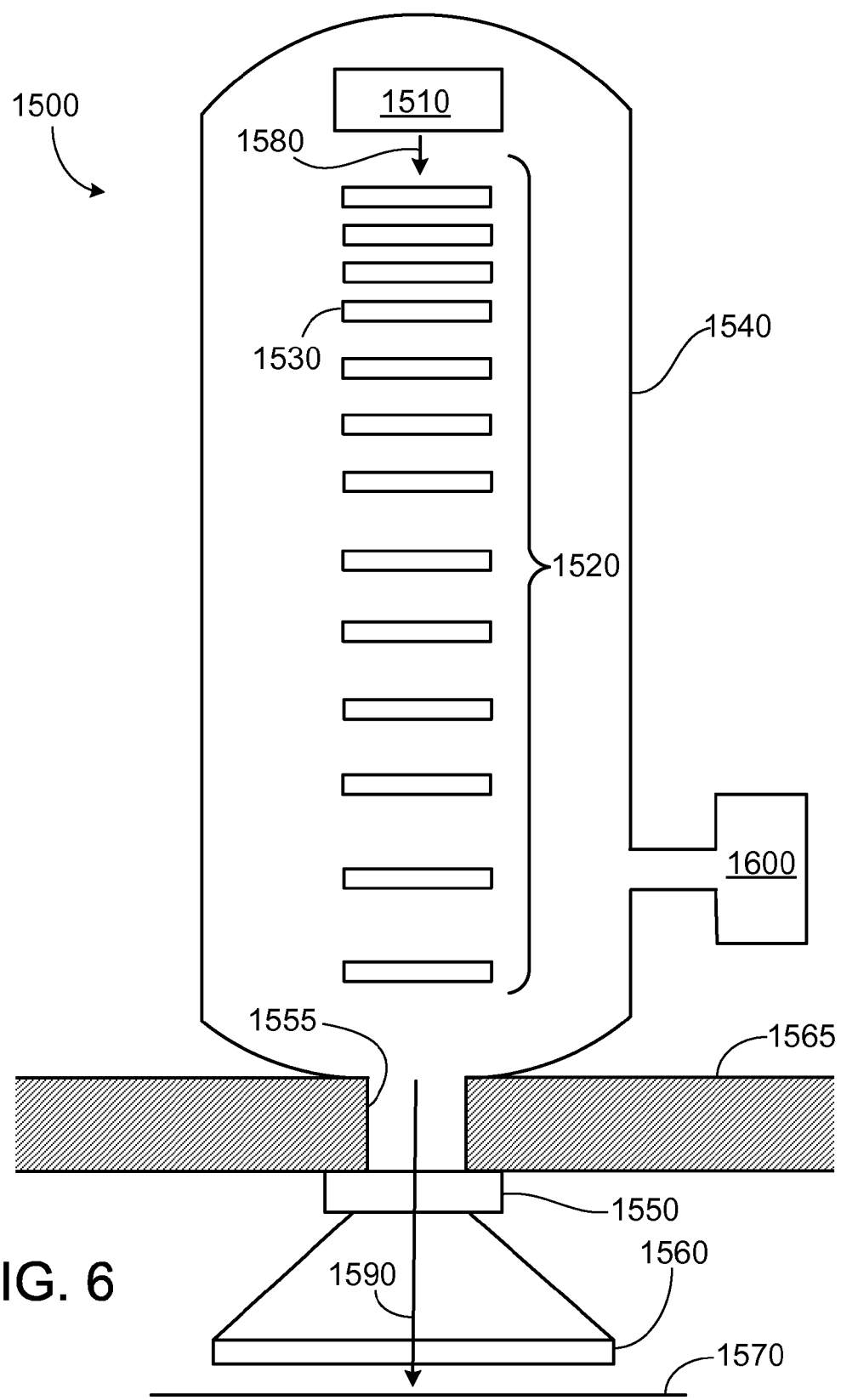
FIG. 6 is a schematic diagram of a DC accelerator.

One type of accelerator that can be used to accelerate ions produced using the sources discussed above is a Dynamitron® (available, for example, from Radiation Dynamics Inc., now a unit of IBA, Louvain-la-Neuve, Belgium). A schematic diagram of a Dynamitron® accelerator 1500 is shown in FIG. 6. Accelerator 1500 includes an injector 1510 (which includes an ion source), and an accelerating column 1520 that includes a plurality of annular electrodes 1530. Injector 1510 and column 1520 are housed within an enclosure 1540 that is evacuated by a vacuum pump 1600.

Injector 1510 produces a beam of ions 1580, and introduces beam 1580 into accelerating column 1520. The annular electrodes 1530 are maintained at different electric potentials, so that ions are accelerated as they pass through gaps between the electrodes (e.g., the ions are accelerated in the gaps, but not within the electrodes, where the electric potentials are uniform). As the ions travel from the top of column 1520 toward the bottom in FIG. 6, the average speed of the ions increases. The spacing between subsequent annular electrodes 1530 typically increases, therefore, to accommodate the higher average ion speed.

After the accelerated ions have traversed the length of column 1520, the accelerated ion beam 1590 is coupled out of enclosure 1540 through delivery tube 1555. The length of delivery tube 1555 is selected to permit adequate shielding (e.g., concrete shielding) to be positioned adjacent to column 1520 to isolate the column. After passing through tube 1555, ion beam 1590 passes through scan magnet 1550. Scan magnet 1550, which is controlled by an external logic unit (not shown), can sweep accelerated ion beam 1590 in controlled fashion across a two-dimensional plane oriented perpendicular to a central axis of column 1520. As shown in FIG. 6, ion beam 1590 passes through window 1560 (e.g., a metal foil window or screen) and then is directed to impinge on selected regions of a sample 1570 by scan magnet 1550.

In some embodiments, the electric potentials applied to electrodes 1530 are static potentials generated, for example, by DC potential sources. In certain embodiments, some or all of the electric potentials applied to electrodes 1530 are variable potentials generated by variable potential sources. Suitable variable sources of large electric potentials include amplified field sources such as klystrons, for example. Accordingly, depending upon the nature of the potentials applied to electrodes 1530, accelerator 1500 can operate in either pulsed or continuous mode.

To achieve a selected accelerated ion energy at the output end of column 1520, the length of column 1520 and the potentials applied to electrodes 1530 are chosen based on considerations that are well-known in the art. However, it is notable that to reduce the length of column 1520, multiply-charged ions can be used in place of singly-charged ions. That is, the accelerating effect of a selected electric potential difference between two electrodes is greater for an ion bearing a charge of magnitude 2 or more than for an ion bearing a charge of magnitude 1. Thus, an arbitrary ion $X^{2+}$ can be accelerated to a final energy E over a shorter length than a corresponding arbitrary ion $X^+$. Triply- and quadruply-charged ions (e.g., $X^{3+}$ and $X^{4+}$) can be accelerated to final energy E over even shorter distances. Therefore, the length of column 1520 can be significantly reduced when ion beam 1580 includes primarily multiply-charged ion species.

To accelerate positively-charged ions, the potential differences between electrodes 1530 of column 1520 are selected so that the direction of increasing field strength in FIG. 6 is downward (e.g., toward the bottom of column 1520). Conversely, when accelerator 1500 is used to accelerate negatively-charged ions, the electric potential differences between electrodes 1530 are reversed in column 1520, and the direction of increasing field strength in FIG. 6 is upward (e.g., toward the top of column 1520). Reconfiguring the electric potentials applied to electrodes 1530 is a straightforward procedure, so that accelerator 1500 can be converted relatively rapidly from accelerating positive ions to accelerating negative ions, or vice versa. Similarly, accelerator 1500 can be converted rapidly from accelerating singly-charged ions to accelerating multiply-charged ions, and vice versa.

Doses

In some embodiments, the irradiating (with any radiation source or a combination of sources) is performed until the material receives a dose of at least 0.05 MRad, e.g., at least 0.1 MRad, at least 0.25 MRad, at least 0.5 MRad, at least 0.75 MRad, at least 1.0 MRad, at least 1.5, MRad, at least 2.0 MRad, at least 2.5 MRad, at least 3.0 MRad, at least 4.0 MRad, at least 5.0 MRad, or at least 10.0 MRad. In some embodiments, the irradiating is performed until the material receives a dose of between 1.0 MRad and 6.0 MRad, e.g., between 1.5 MRad and 4.0 MRad. In some embodiments, a preferred dose is from about 0.25 to about 5 MRad. The dose is selected so as to be sufficient to increase the molecular weight of the cellulosic material, e.g., by cross-linking the cellulose chains, while being sufficiently low so as not to depolymerize or otherwise deleteriously affect the cellulosic material.

The doses discussed above are also suitable for functionalization of the material, with the degree of functionalization generally being higher the higher the dose.

In some embodiments, the irradiating is performed at a dose rate of between 5.0 and 1500.0 kilorads/hour, e.g., between 10.0 and 750.0 kilorads/hour or between 50.0 and 350.0 kilorads/hours. When high throughput is desired, radiation can be applied at, e.g., 0.5 to 3.0 MRad/sec, or even faster, using cooling to avoid overheating the irradiated material.

It can be desirable to irradiate multiple times to achieve a given final dose, e.g., by delivering a 1 MRad dose 10 times, to provide a final dose of 10 MRad. This may prevent overheating of the irradiated material, particularly if the material is cooled between doses.

If gamma radiation is utilized as the radiation source, a dose of from about 1 Mrad to about 10 Mrad, e.g., from about 1.5 Mrad to about 7.5 Mrad or from about 2.0 Mrad to about 5.0 Mrad, can be applied.

If e-beam radiation is utilized, a smaller dose can be utilized (relative to gamma radiation), such as a dose of from about 0.1 Mrad to about 5 Mrad, e.g., between about 0.2 Mrad to about 3 Mrad, or between about 0.25 Mrad and about 2.5 Mrad.

In some embodiments, two or more radiation sources are used, such as two or more ionizing radiations. For example, samples can be treated, in any order, with a beam of electrons, followed by gamma radiation and UV light having wavelengths from about 100 nm to about 280 nm. In some embodiments, samples are treated with three ionizing radiation sources, such as a beam of electrons, gamma radiation, and energetic UV light.

Types of Cellulosic Textiles

Suitable cellulosic materials include materials that have an α-cellulose level of less than about 93% by weight, preferably less than about 90%, for example less than about 85%. The balance of the cellulosic material is generally comprised of lignin, hemicellulose, pectin, and other naturally occurring substances. For example, flax fiber obtained from natural (non-transgenically modified) flax plants has an α-cellulose content of about 70%, with the balance being hemicellulose, lignin, and pectin.

It is generally also preferred that the cellulosic material have a lignin content of at least 2%, in some cases at least 5%, at least 10% or at least 20%. Without wishing to be bound by theory, the inventors believe that lignin, a high molecular weight three-dimensional molecule, acts as a plasticizer and anti-oxidant and tends to stabilize the cellulosic material during and after irradiation, e.g., in the 0.5 to 5 MRad range.

In some implementations, lignin may be added to the textile as an additive. For example, lignin can be applied to the textile or starting cellulosic material in a manner so as to penetrate the cellulosic material. In some cases, lignin will cross-link during irradiation, enhancing the properties of the irradiated product. In some implementations, lignin is added to increase the lignin content of a cellulosic material that has a relatively low lignin content in its natural state. For example up to 1, 2, 3, 4, 5, 7.5, 10, 15, 20, or even 25% by weight of lignin can be added. The lignin can be added as a solid, e.g., as a powder or other particulate material, or can be dissolved or dispersed and added in liquid form. In the latter case, the lignin can be dissolved in solvent or a solvent system. The solvent or solvent system can be in the form of a single phase or two or more phases. Solvent systems for cellulosic and lignocellulosic materials include DMSO-salt systems. Such systems include, for example, DMSO in combination with a lithium, magnesium, potassium, sodium or zinc salt. Lithium salts include LiCl, LiBr, LiI, lithium perchlorate and lithium nitrate. Magnesium salts include magnesium nitrate and magnesium chloride. Potassium salts include potassium iodide and nitrate. Examples of sodium salts include sodium iodide and nitrate. Examples of zinc salts include zinc chloride and nitrate. Any salt can be anhydrous or hydrated. Typical loadings of the salt in the DMSO are between about 1 and about 50 percent, e.g., between about 2 and 25, between about 3 and 15 or between about 4 and 12.5 percent by weight.

In some cases, lignin will cross-link in the paper during irradiation, further enhancing the physical properties of the textile material.

Some suitable cellulosic materials have a hemicellulose content of at least 5%, in some cases at least 10% or at least 20%.

The compositions of certain cellulosic fibers are given in Table 1 below.

TABLE 1

| Fiber | Cellulose | Lignin | Hemicellulose |
|---|---|---|---|
| Flax | 71 | 2 | 19 |
| Hemp | 75 | 4 | 18 |
| Jute | 72 | 13 | 13 |
| Abaca | 70 | 6 | 22 |
| Sisal | 73 | 11 | 13 |
| Cotton | 93 | — | 3 |
| Wheat Straw | 51 | 16 | 26 |
| "LF" (lignocellulose filler -- a byproduct of industrial wheat straw fractionation) | 58 | 31 | 8 |

From "Effects of Lignin Content on the Properties of Lignocellulose-based Biocomposites," Le Digabel et al., *Carbohydrate Polymers*, 2006.

The cellulose chains in the cellulosic material can be unmodified, i.e., that no synthetic polymer be grafted to the cellulosic chains before or during irradiation.

Suitable cellulosic and lignocellulosic materials include, but are not limited to, for example, cotton, flax (e.g., linen), hemp, jute, abaca, sisal, wheat straw, LF, ramie, bamboo fibers, algae, seaweed, cuprammonium cellulose (rayon), regenerated wood cellulose, lyocell, cellulose acetate, and blends thereof. Other fiber source materials such as corn, milk, soy, and chitin, have been discussed elsewhere herein.

In some cases, cellulosic or lignocellulosic material is dissolved in a solvent or solvent system and spun or extruded to form fibers or filaments. The solvent or solvent system can be in the form of a single phase or two or more phases. Solvent systems for cellulosic and lignocellulosic materials include the DMSO-salt systems discussed above. Spinning or extrusion can be accomplished, for example, using techniques well known in the textile field. The cellulosic or lignocellulosic material can be irradiated, and/or the solution or the fibers or filaments can be irradiated.

The cellulose material can be in the form of fibers, staple fibers, filaments, yarns, or fabrics. Fabrics include nonwovens, wovens and knitted fabrics. The fibers may have a high aspect ratio (L/D). For example, the average length-to-diameter ratio of the fibers can be greater than 8/1, e.g., greater than 10/1, greater than 15/1, greater than 20/1, greater than 25/1, or greater than 50/1. An average length of the fibers can be, e.g., between about 0.5 mm and 2.5 mm, e.g., between about 0.75 mm and 1.0 mm, and an average width (i.e., diameter) of the fibers can be, e.g., between about 5 μm and 50 μm, e.g., between about 10 μm and 30 μm.

The fiber, yarn, or fabric can have a relatively low bulk density, to allow easier penetration by particles and thus faster throughput. The bulk density can be, for example, about 0.1 to 0.5 g/cm$^3$, e.g., about 0.3 to 0.15 g/cm$^3$. Low bulk density also facilitates cooling of the material when the material is heated by irradiation. In some implementations, the fibers have a relatively small diameter, for example, an average diameter of about 1-500 microns, e.g., 5-150 microns, or 25-100 microns. These small fiber diameters generally provide the textile with a low bulk density and good airflow, which can provide cooling during irradiation.

Textile Additives

Any of the many additives and coatings used in the textile industry can be added to or applied to the fibrous materials, fabrics, or any other materials and products described herein.

Additives include fillers such as calcium carbonate, plastic pigments, graphite, wollastonite, mica, glass, fiber glass, silica, and talc; inorganic flame retardants such as alumina trihydrate or magnesium hydroxide; organic flame retardants such as chlorinated or brominated organic compounds; carbon fibers; metal fibers or powders (e.g., aluminum, stainless steel). These additives can reinforce, extend, or change electrical, mechanical, compatibility or other properties. Other additives include starch, lignin, fragrances, coupling agents, antioxidants, opacifiers, heat stabilizers, colorants such as dyes and pigments, polymers, e.g., degradable polymers, photostabilizers, and biocides. Representative degradable polymers include polyhydroxy acids, e.g., polylactides, polyglycolides and copolymers of lactic acid and glycolic acid, poly(hydroxybutyric acid), poly(hydroxyvaleric acid), poly[lactide-co-($\epsilon$-caprolactone)], poly[glycolide-co-(e-caprolactone)], polycarbonates, poly(amino acids), poly(hydroxyalkanoate)s, polyanhydrides, polyorthoesters and blends of these polymers.

Additives that can in some cases be cross-linked by irradiation, e.g., lignin and sizing such as starch, may be added or applied to the textile before and/or after irradiation.

When described additives are included, they can be present in amounts, calculated on a dry weight basis, of from below about 1 percent to as high as about 15 percent, based on total weight of the fibrous material. More typically, amounts range from between about 0.5 percent to about 7.5 percent by weight.

Any additives described herein can be encapsulated, e.g., spray dried or microencapsulated, e.g., to protect the additives from heat or moisture during handling.

Suitable coatings include any of the many coatings used in the textile industry to provide specific surface characteristics, including performance characteristics required for particular types of garments or other applications. For example, the textile may include a waterproof or water-resistant coating.

As mentioned above, various fillers can be included in the fibers, yarns, textiles or finished products. These fillers may serve, for example, as frictionizing agents, in sizings, as flameproofing or fireproofing agents, for thermal protection, and to impart water repellency. For example, inorganic fillers such as calcium carbonate (e.g., precipitated calcium carbonate or natural calcium carbonate), aragonite clay, orthorhombic clays, calcite clay, rhombohedral clays, kaolin clay, bentonite clay, dicalcium phosphate, tricalcium phosphate, calcium pyrophosphate, insoluble sodium metaphosphate, precipitated calcium carbonate, magnesium orthophosphate, trimagnesium phosphate, hydroxyapatites, synthetic apatites, alumina, silica xerogel, metal aluminosilicate complexes, sodium aluminum silicates, zirconium silicate, silicon dioxide, or combinations of the inorganic additives can be used. The fillers can have, e.g., a particle size of greater than 1 micron, e.g., greater than 2 micron, 5 micron, 10 micron, 25 micron or even greater than 35 microns.

Nanometer scale fillers can also be used alone, or in combination with fibrous materials of any size and/or shape. The fillers can be in the form of, e.g., a particle, a plate or a fiber. For example, nanometer sized clays, silicon and carbon nanotubes, and silicon and carbon nanowires can be used. The filler can have a transverse dimension less than 1000 nm, e.g., less than 900 nm, 800 nm, 750 nm, 600 nm, 500 nm, 350 nm, 300 nm, 250 nm, 200 nm, less than 100 nm, or even less than 50 nm.

In some embodiments, the nano-clay is a montmorillonite. Such clays are available from Nanocor, Inc. and Southern Clay products, and have been described in U.S. Pat. Nos. 6,849,680 and 6,737,464. The clays can be surface treated before mixing into, e.g., a resin or a fibrous material. For example, the clay can be surface is treated so that its surface is ionic in nature, e.g., cationic or anionic.

Aggregated or agglomerated nanometer scale fillers, or nanometer scale fillers that are assembled into supramolecular structures, e.g., self-assembled supramolecular structures can also be used. The aggregated or supramolecular fillers can be open or closed in structure, and can have a variety of shapes, e.g., cage, tube or spherical.

Ion Generation

Various methods may be used for the generation of ions suitable for ion beams which may be used in treating the cellulosic or lignocellulosic materials. After the ions have been generated, they are typically accelerated in one or more of various types of accelerators, and then directed to impinge on the cellulosic or lignocellulosic materials.

(i) Hydrogen Ions

Hydrogen ions can be generated using a variety of different methods in an ion source. Typically, hydrogen ions are introduced into an ionizing chamber of an ion source, and ions are produced by supplying energy to gas molecules. During operation, such chambers can produce large ion currents suitable for seeding a downstream ion accelerator.

Figure 7:
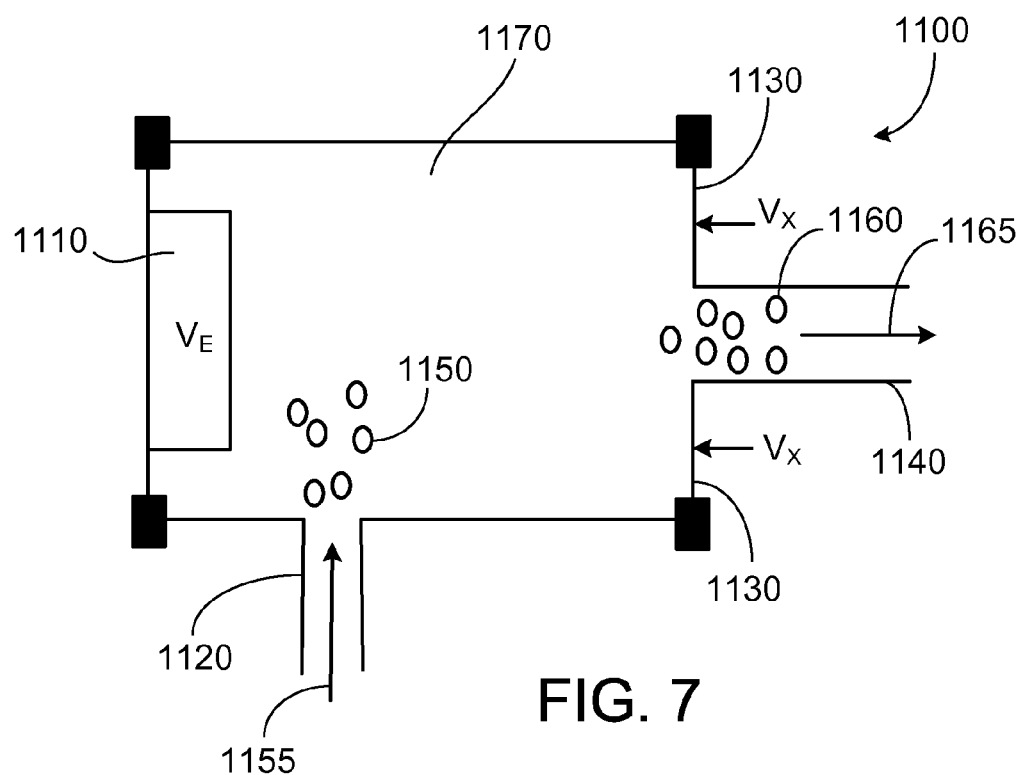
FIG. 7 is a schematic diagram of a field ionization source.

In some embodiments, hydrogen ions are produced via field ionization of hydrogen gas. A schematic diagram of a field ionization source is shown in FIG. 7. Field ionization source 1100 includes a chamber 1170 where ionization of gas molecules (e.g., hydrogen gas molecules) occurs. Gas molecules 1150 enter chamber 1170 by flowing along direction 1155 in supply tube 1120. Field ionization source 1100 includes an ionization electrode 1110. During operation, a large potential $V_E$ (relative to a common system ground potential) is applied to electrode 1110. Molecules 1150 that circulate within a region adjacent to electrode 1110 are ionized by the electric field that results from potential $V_E$. Also during operation, an extraction potential $V_X$ is applied to extractors 1130. The newly-formed ions migrate towards extractors 1130 under the influence of the electric fields of potentials $V_E$ and $V_X$. In effect, the newly-formed ions experience repulsive forces relative to ionization electrode 1110, and attractive forces relative to extractors 1130. As a result, certain of the newly-formed ions enter discharge tube 1140, and propagate along direction 1165 under the influence of potentials $V_E$ and $V_X$.

Depending upon the sign of potential $V_E$ (relative to the common ground potential), both positively and negatively charged ions can be formed. For example, in some embodiments, a positive potential can be applied to electrode 1110 and a negative potential can be applied to extractors 1130. Positively charged hydrogen ions (e.g., protons $H^+$) that are generated in chamber 1170 are repelled away from electrode 1110 and toward extractors 1130. As a result, discharged particle stream 1160 includes positively charged hydrogen ions that are transported to an injector system.

In certain embodiments, a negative potential can be applied to electrode 1110 and a positive potential can be applied to extractors 1130. Negatively charged hydrogen ions (e.g., hydride ions $H^-$) that are generated in chamber 1170 are repelled away from electrode 1110 and toward extractors 1130. Discharged particle stream 1160 includes negatively charged hydrogen ions, which are then transported to an injector system.

In some embodiments, both positive and negative hydrogen ions can be produced via direct thermal heating of hydrogen gas. For example, hydrogen gas can be directed to enter a heating chamber that is evacuated to remove residual oxygen and other gases. The hydrogen gas can then be heated via a heating element to produce ionic species. Suitable heating elements include, for example, arc discharge electrodes, heating filaments, heating coils, and a variety of other thermal transfer elements.

Figure 8:
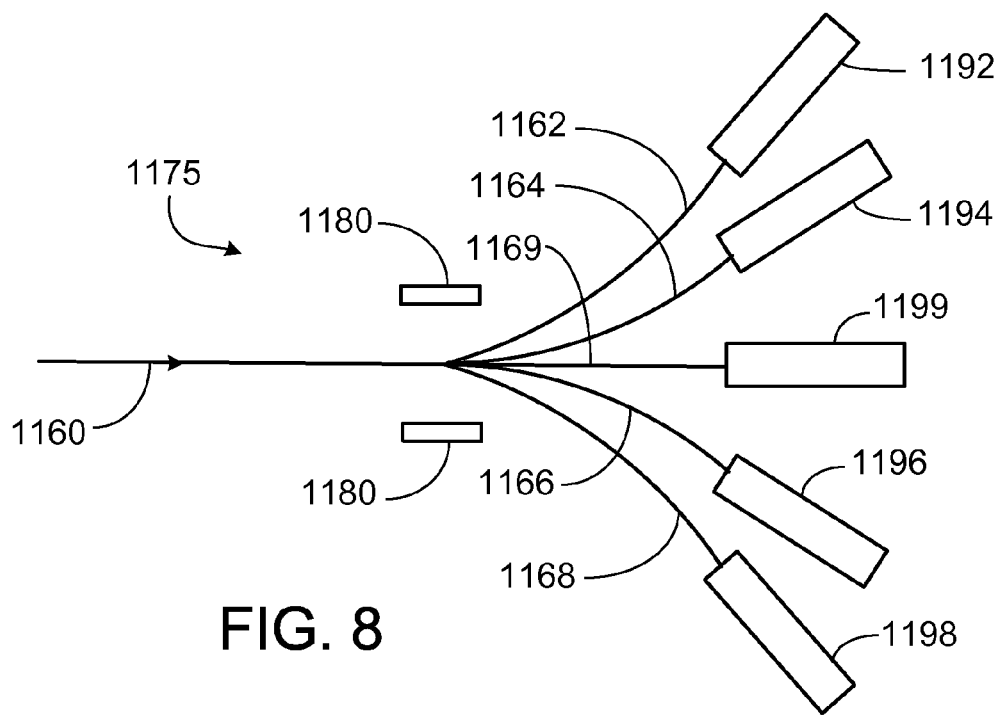
FIG. 8 is a schematic diagram of an electrostatic ion separator.

In certain embodiments, when hydrogen ions are produced via either field emission or thermal heating, various hydrogen ion species can be produced, including both positively and negatively charged ion species, and singly- and multiply-charged ion species. The various ion species can be separated from one another via one or more electrostatic and/or magnetic separators. FIG. 8 shows a schematic diagram of an electrostatic separator 1175 that is configured to separate a plurality of hydrogen ion species from one another. Electrostatic separator 1175 includes a pair of parallel electrodes 1180 to which a potential $V_S$ is applied by a voltage source (not shown). Particle stream 1160, propagating in the direction indicated by the arrow, includes a variety of positively- and negatively-charged, and singly- and multiply-charged, ion species. As the various ion species pass through electrodes 1180, the electric field between the electrodes deflects the ion trajectories according to the magnitude and sign of the ion species. In FIG. 8, for example, the electric field points from the lower electrode toward the upper electrode in the region between electrodes 1180. As a result, positively-charged ions are deflected along an upward trajectory in FIG. 8, and negatively-charged ions are deflected along a downward trajectory. Ion beams 1162 and 1164 each correspond to positively-charged ion species, with the ion species in ion beam 1162 having a larger positive charge than the ion species is beam 1164 (e.g., due to the larger positive charge of the ions in beam 1162, the beam is deflected to a greater extent).

Similarly, ion beams 1166 and 1168 each correspond to negatively-charged ion species, with the ion species in ion beam 1168 having a larger negative charge than the ion species in ion beam 1166 (and thereby being deflected to a larger extent by the electric field between electrodes 1180). Beam 1169 includes neutral particles originally present in particle stream 1160; the neutral particles are largely unaffected by the electric field between electrodes 1180, and therefore pass undeflected through the electrodes. Each of the separated particle streams enters one of delivery tubes 1192, 1194, 1196, 1198, and 1199, and can be delivered to an injector system for subsequent acceleration of the particles, or steered to be incident directly on the cellulosic or lignocellulosic material. Alternatively, or in addition, any or all of the separated particle streams can be blocked to prevent ion and/or atomic species from reaching cellulosic or lignocellulosic material. As yet another alternative, certain particle streams can be combined and then directed to an injector system and/or steered to be incident directly on the cellulosic or lignocellulosic material using known techniques.

In general, particle beam separators can also use magnetic fields in addition to, or rather than, electric fields for deflecting charged particles. In some embodiments, particle beam separators include multiple pairs of electrodes, where each pair of electrodes generates an electric field that deflects particles passing therethrough. Alternatively, or in addition, particle beam separators can include one or more magnetic deflectors that are configured to deflect charged particles according to magnitude and sign of the particle charges.

(ii) Noble Gas Ions

Figure 9:
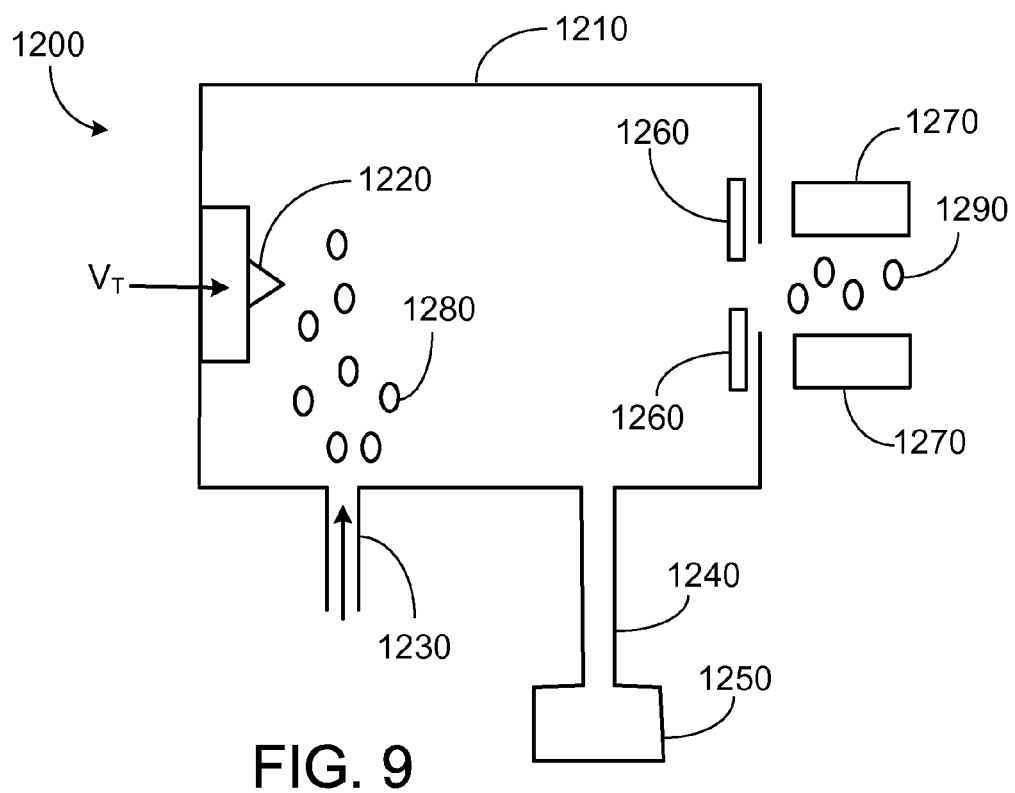
FIG. 9 is a schematic diagram of a field ionization generator.

Noble gas atoms (e.g., helium atoms, neon atoms, argon atoms) form positively-charged ions when acted upon by relatively strong electric fields. Methods for generating noble gas ions therefore typically include generating a high-intensity electric field, and then introducing noble gas atoms into the field region to cause field ionization of the gas atoms. A schematic diagram of a field ionization generator for noble gas ions (and also for other types of ions) is shown in FIG. 9. Field ionization generator 1200 includes a tapered electrode 1220 positioned within a chamber 1210. A vacuum pump 1250 is in fluid communication with the interior of chamber 1210 via inlet 1240, and reduces the pressure of background gases within chamber 1210 during operation. One or more noble gas atoms 1280 are admitted to chamber 1210 via inlet tube 1230.

During operation, a relatively high positive potential $V_T$ (e.g., positive relative to a common external ground) is applied to tapered electrode 1220. Noble gas atoms 1280 that enter a region of space surrounding the tip of electrode 1220 are ionized by the strong electric field extending from the tip; the gas atoms lose an electron to the tip, and form positively charged noble gas ions.

The positively charged noble gas ions are accelerated away from the tip, and a certain fraction of the gas ions 1290 pass through extractor 1260 and exit chamber 1210, into an ion optical column that includes lens 1270, which further deflects and/or focuses the ions.

Electrode 1220 is tapered to increase the magnitude of the local electric field in the region near the apex of the tip. Depending upon the sharpness of the taper and the magnitude of potential $V_T$, the region of space in chamber 1210 within which ionization of noble gas atoms occurs can be relatively tightly controlled. As a result, a relatively well collimated beam of noble gas ions 1290 can be obtained following extractor 1260.

As discussed above in connection with hydrogen ions, the resulting beam of noble gas ions 1290 can be transported through a charged particle optical column that includes various particle optical elements for deflecting and/or focusing the noble gas ion beam. The noble gas ion beam can also pass through an electrostatic and/or magnetic separator, as discussed above in connection with FIG. 8.

Noble gas ions that can be produced in field ionization generator 1200 include helium ions, neon ions, argon ions, and krypton ions. In addition, field ionization generator 1200 can be used to generate ions of other gaseous chemical species, including hydrogen, nitrogen, and oxygen.

Noble gas ions may have particular advantages relative to other ion species when treating cellulosic or lignocellulosic material. For example, while noble gas ions can react with cellulosic or lignocellulosic materials, neutralized noble gas ions (e.g., noble gas atoms) that are produced from such reactions are generally inert, and do not further react with the cellulosic or lignocellulosic material. Moreover, neutral noble gas atoms do not remain embedded in the cellulosic or lignocellulosic material, but instead diffuse out of the material. Noble gases are non-toxic and can be used in large quantities without adverse consequences to either human health or the environment.

(iii) Carbon, Oxygen, and Nitrogen Ions

Ions of carbon, oxygen, and nitrogen can typically be produced by field ionization in a system such as field ionization source 1100 or field ionization generator 1200. For example, oxygen gas molecules and/or oxygen atoms (e.g., produced by heating oxygen gas) can be introduced into a chamber, where the oxygen molecules and/or atoms are field ionized to produce oxygen ions. Depending upon the sign of the potential applied to the field ionization electrode, positively- and/or negatively-charged oxygen ions can be produced. The desired ion species can be preferentially selected from among various ion species and neutral atoms and molecules by an electrostatic and/or magnetic particle selector, as shown in FIG. 8.

As another example, nitrogen gas molecules can be introduced into the chamber of either field ionization source 1100 or field ionization generator 1200, and ionized to form positively- and/or negatively-charged nitrogen ions by the relatively strong electric field within the chamber. The desired ion species can then be separated from other ionic and neutral species via an electrostatic and/or magnetic separator, as shown in FIG. 8.

To form carbon ions, carbon atoms can be supplied to the chamber of either field ionization source 1100 or field ionization generator 1200, wherein the carbon atoms can be ionized to form either positively- and/or negatively-charged carbon ions. The desired ion species can then be separated from other ionic and neutral species via an electrostatic and/or magnetic separator, as shown in FIG. 8. The carbon atoms that are supplied to the chamber of either field ionization source 1100 or field ionization generator 1200 can be produced by heating a carbon-based target (e.g., a graphite target) to cause thermal emission of carbon atoms from the target. The target can be placed in relatively close proximity to the chamber, so that emitted carbon atoms enter the chamber directly following emission.

(iv) Heavier Ions

Ions of heavier atoms such as sodium and iron can be produced via a number of methods. For example, in some embodiments, heavy ions such as sodium and/or iron ions are produced via thermionic emission from a target material that includes sodium and/or iron, respectively. Suitable target materials include materials such as sodium silicates and/or iron silicates. The target materials typically include other inert materials such as beta-alumina. Some target materials are zeolite materials, and include channels formed therein to permit escape of ions from the target material.

Figure 10:
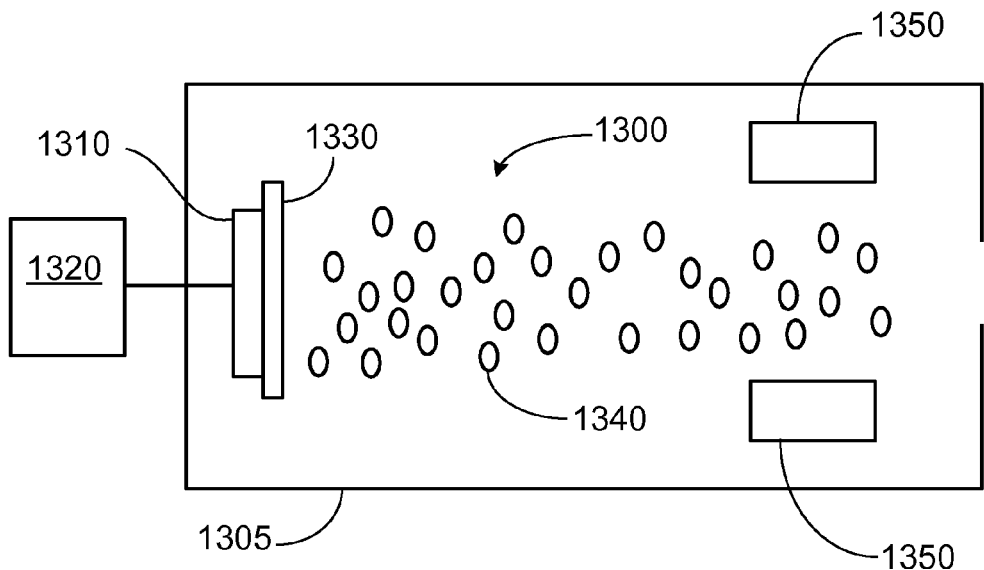
FIG. 10 is a schematic diagram of a thermionic emission source.

FIG. 10 shows a thermionic emission source 1300 that includes a heating element 1310 that contacts a target material 1330, both of which are positioned inside an evacuated chamber 1305. Heating element 1310 is controlled by controller 1320, which regulates the temperature of heating element 1310 to control the ion current generated from target material 1330. When sufficient heat is supplied to target material 1330, thermionic emission from the target material generates a stream of ions 1340. Ions 1340 can include positively-charged ions of materials such as sodium, iron, and other relatively heavy atomic species (e.g., other metal ions). Ions 1340 can then be collimated, focused, and/or otherwise deflected by electrostatic and/or magnetic electrodes 1350, which can also deliver ions 1340 to an injector.

Thermionic emission to form ions of relatively heavy atomic species is also discussed, for example, in U.S. Pat. No. 4,928,033, entitled "Thermionic Ionization Source," the entire contents of which are incorporated herein by reference.

Figure 11:
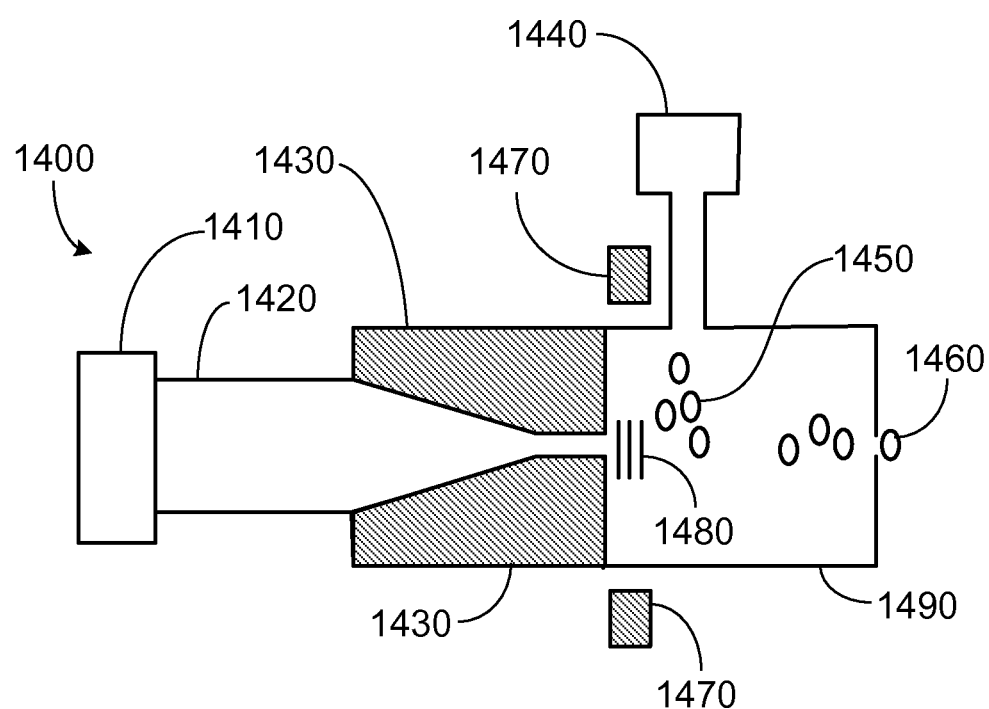
FIG. 11 is a schematic diagram of a microwave discharge ion source.

In certain embodiments, relatively heavy ions such as sodium ions and/or iron ions can be produced by microwave discharge. FIG. 11 shows a schematic diagram of a microwave discharge source 1400 that produces ions from relatively heavy atoms such as sodium and iron. Discharge source 1400 includes a microwave field generator 1410, a waveguide tube 1420, a field concentrator 1430, and an ionization chamber 1490. During operation, field generator 1410 produces a microwave field which propagates through waveguide 1420 and concentrator 1430; concentrator 1430 increases the field strength by spatially confining the field, as shown in FIG. 11. The microwave field enters ionization chamber 1490. In a first region inside chamber 1490, a solenoid 1470 produces a strong magnetic field 1480 in a region of space that also includes the microwave field. Source 1440 delivers atoms 1450 to this region of space. The concentrated microwave field ionizes atoms 1450, and the magnetic field 1480 generated by solenoid 1470 confines the ionized atoms to form a localized plasma. A portion of the plasma exits chamber 1490 as ions 1460. Ions 1460 can then be deflected and/or focused by one or more electrostatic and/or magnetic elements, and delivered to an injector.

Atoms 1450 of materials such as sodium and/or iron can be generated by thermal emission from a target material, for example. Suitable target materials include materials such as silicates and other stable salts, including zeolite-based materials. Suitable target materials can also include metals (e.g., iron), which can be coated on an inert base material such as a glass material.

Microwave discharge sources are also discussed, for example, in the following U.S. Pat. No. 4,409,520, entitled "Microwave Discharge Ion Source," and U.S. Pat. No. 6,396,211, entitled "Microwave Discharge Type Electrostatic Accelerator Having Upstream and Downstream Acceleration Electrodes." The entire contents of each of the foregoing patents are incorporated herein by reference.

Particle Beam Sources

Particle beam sources that generate beams for use in irradiating cellulosic or lignocellulosic material typically include three component groups: an injector, which generates or receives ions and introduces the ions into an accelerator; an accelerator, which receives ions from the injector and increases the kinetic energy of the ions; and output coupling elements, which manipulate the beam of accelerated ions.

(i) Injectors

Injectors can include, for example, any of the ion sources discussed in the preceding sections above, which supply a stream of ions for subsequent acceleration. Injectors can also include various types of electrostatic and/or magnetic particle optical elements, including lenses, deflectors, collimators, filters, and other such elements. These elements can be used to condition the ion beam prior to entering the accelerator; that is, these elements can be used to control the propagation characteristics of the ions that enter the accelerator. Injectors can also include pre-accelerating electrostatic and/or magnetic elements that accelerate charged particles to a selected energy threshold prior to entering the accelerator. An example of an injector is shown in Iwata, Y. et al.

(ii) Accelerators

One type of accelerator that can be used to accelerate ions produced using the sources discussed above is a Dynamitron® (available, for example, from Radiation Dynamics Inc., now a unit of IBA, Louvain-la-Neuve, Belgium). A schematic diagram of a Dynamitron® accelerator 1500 is shown in FIG. 6 and discussed above.

Another type of accelerator that can be used to accelerate ions for treatment of cellulosic or lignocellulosic-based material is a Rhodotron® accelerator (available, for example, from IBA, Louvain-la-Neuve, Belgium). In general, Rhodotron-type accelerators include a single recirculating cavity through which ions that are being accelerated make multiple passes. As a result, Rhodotron® accelerators can be operated in continuous mode at relatively high continuous ion currents.

Figure 12:
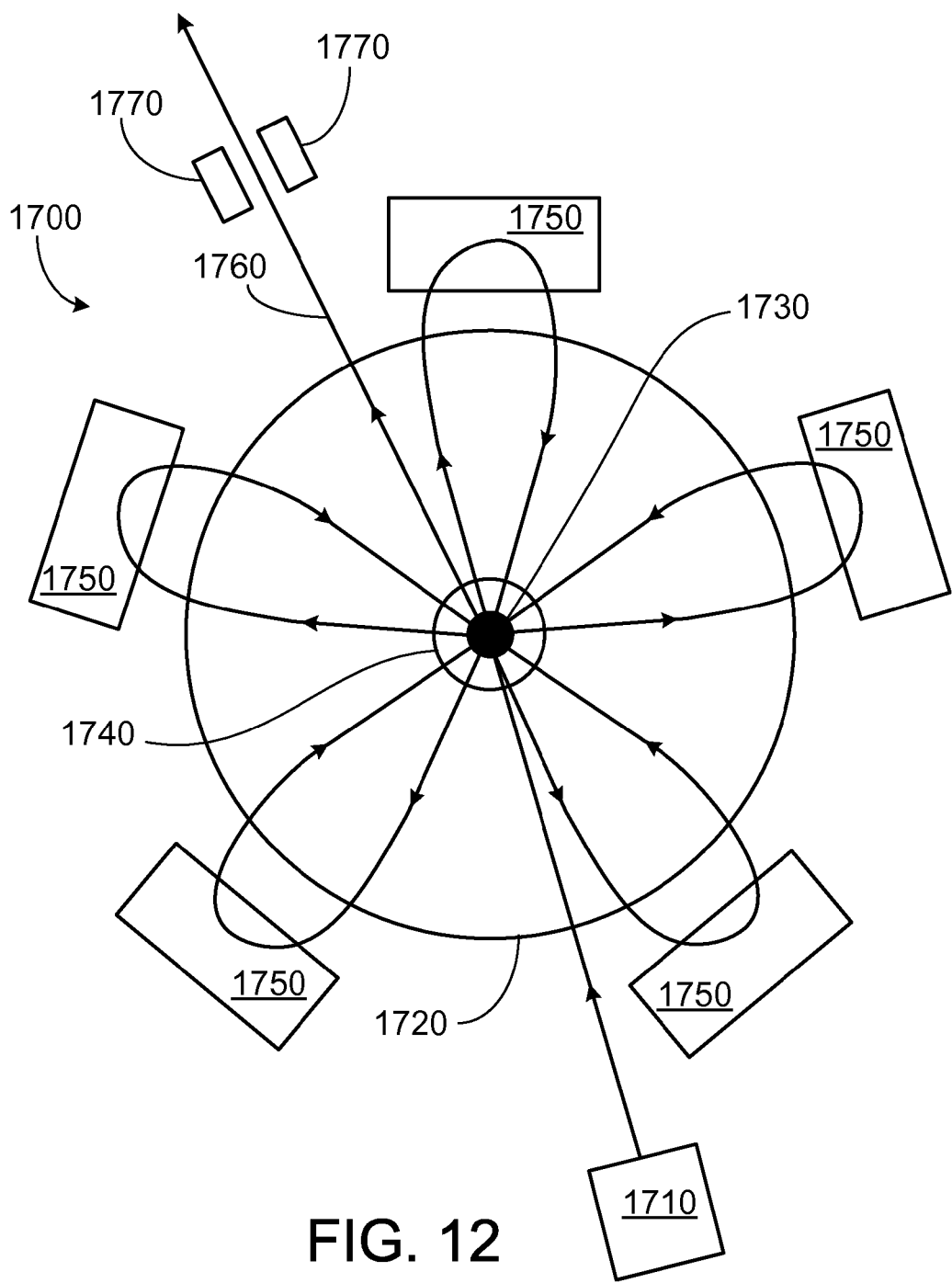
FIG. 12 is a schematic diagram of a recirculating accelerator.

FIG. 12 shows a schematic diagram of a Rhodotron® accelerator 1700. Accelerator 1700 includes an injector 1710, which introduces accelerated ions into recirculating cavity 1720. An electric field source 1730 is positioned within an inner chamber 1740 of cavity 1720, and generates an oscillating radial electric field. The oscillation frequency of the radial field is selected to match the transit time of injected ions across one pass of recirculating cavity 1720. For example, a positively-charged ion is injected into cavity 1720 by injector 1710 when the radial electric field in the cavity has zero amplitude. As the ion propagates toward chamber 1740, the amplitude of the radial field in chamber 1740 increases to a maximum value, and then decreases again. The radial field points inward toward chamber 1740, and the ion is accelerated by the radial field. The ion passes through a hole in the wall of inner chamber 1740, crosses the geometrical center of cavity 1720, and passes out through another hole in the wall of inner chamber 1740. When the ion is positioned at the enter of cavity 1720, the electric field amplitude inside cavity 1720 has been reduced to zero (or nearly zero). As the ion emerges from inner chamber 1740, the electric field amplitude in cavity 1720 begins to increase again, but the field is now oriented radially outward. The field magnitude during the second half of the ion's pass through cavity 1720 again reaches a maximum and then begins to diminish. As a result, the positive ion is again accelerated by the electric field as the ion completes the second half of a first pass through cavity 1720.

Upon reaching the wall of cavity 1720, the magnitude of the electric field in cavity 1720 is zero (or nearly zero) and the ion passes through an aperture in the wall and encounters one of beam deflection magnets 1750. The beam deflection magnets essentially reverse the trajectory of the ion, as shown in FIG. 12, directing the ion to re-enter cavity 1720 through another aperture in the wall of the chamber. When the ion re-enters cavity 1720, the electric field therein begins to increase in amplitude again, but is now once more oriented radially inward. The second and subsequent passes of the ion through cavity 1720 follow a similar pattern, so that the orientation of the electric field always matches the direction of motion of the ion, and the ion is accelerated on every pass (and every half-pass) through cavity 1720.

As shown in FIG. 12, after six passes through cavity 1720, the accelerated ion is coupled out of cavity 1720 as a portion of accelerated ion beam 1760. The accelerated ion beam passes through one or more electrostatic and/or magnetic particle optical elements 1770, which can include lenses, collimators, beam deflectors, filters, and other optical elements. For example, under control of an external logic unit, elements 1770 can include an electrostatic and/or magnetic deflector that sweeps accelerated beam 1760 across a two-dimensional planar region oriented perpendicular to the direction of propagation of beam 1760.

Ions that are injected into cavity 1720 are accelerated on each pass through cavity 1720. In general, therefore, to obtain accelerated beams having different average ion energies, accelerator 1700 can include more than one output coupling. For example, in some embodiments, one or more of deflection magnets 1750 can be modified to allow a portion of the ions reaching the magnets to be coupled out of accelerator 1700, and a portion of the ions to be returned to chamber 1720. Multiple accelerated output beams can therefore be obtained from accelerator 1700, each beam corresponding to an average ion energy that is related to the number of passes through cavity 1720 for the ions in the beam.

Accelerator 1700 includes 5 deflection magnets 1750, and ions injected into cavity 1720 make 6 passes through the cavity. In general, however, accelerator 1700 can include any number of deflection magnets, and ions injected into cavity 1720 can make any corresponding number of passes through the cavity. For example, in some embodiments, accelerator 1700 can include at least 6 deflection magnets and ions can make at least 7 passes through the cavity (e.g., at least 7 deflection magnets and 8 passes through the cavity, at least 8 deflection magnets and 9 passes through the cavity, at least 9 deflection magnets and 10 passes through the cavity, at least 10 deflection magnets and 11 passes through the cavity).

Typically, the electric field generated by field source 1730 provides a single-cavity-pass gain of about 1 MeV to an injected ion. In general, however, higher single-pass gains are possible by providing a higher-amplitude electric field within cavity 1720. In some embodiments, for example, the single-cavity-pass gain is about 1.2 MeV or more (e.g., 1.3 MeV or more, 1.4 MeV or more, 1.5 MeV or more, 1.6 MeV or more, 1.8 MeV or more, 2.0 MeV or more, 2.5 MeV or more).

The single-cavity-pass gain also depends upon the magnitude of the charge carried by the injected ion. For example, ions bearing multiple charges will experience higher single-pass-cavity gain than ions bearing single charges, for the same electric field within cavity. As a result, the single-pass-cavity gain of accelerator 1700 can be further increased by injecting ions having multiple charges.

In the foregoing description of accelerator 1700, a positively-charged ion was injected into cavity 1720. Accelerator 1700 can also accelerate negatively charged ions. To do so, the negatively charged ions are injected so that the direction of their trajectories is out of phase with the radial electric field direction. That is, the negatively charged ions are injected so that on each half pass through cavity 1720, the direction of the trajectory of each ion is opposite to the direction of the radial electric field. Achieving this involves simply adjusting the time at which negatively-charged ions are injected into cavity 1720. Accordingly, accelerator 1700 is capable of simultaneously accelerating ions having the same approximate mass, but opposite charges. More generally, accelerator 1700 is capable of simultaneously accelerating different types of both positively- and negatively-charged (and both singly- and multiply-charged) ions, provided that the transit times of the ions across cavity 1720 are relatively similar. In some embodiments, accelerator 1700 can include multiple output couplings, providing different types of accelerated ion beams having similar or different energies.

Other types of accelerators can also be used to accelerate ions for irradiation of cellulosic or lignocellulosic material. For example, in some embodiments, ions can be accelerated to relatively high average energies in cyclotron- and/or synchrotron-based accelerators. The construction and operation of such accelerators is well-known in the art. As another example, in some embodiments, Penning-type ion sources can be used to generate and/or accelerate ions for treating cellulosic or lignocellulosic-based material. The design of Penning-type sources is discussed in section 7.2.1 of Prelec (1997).

Figure 13:
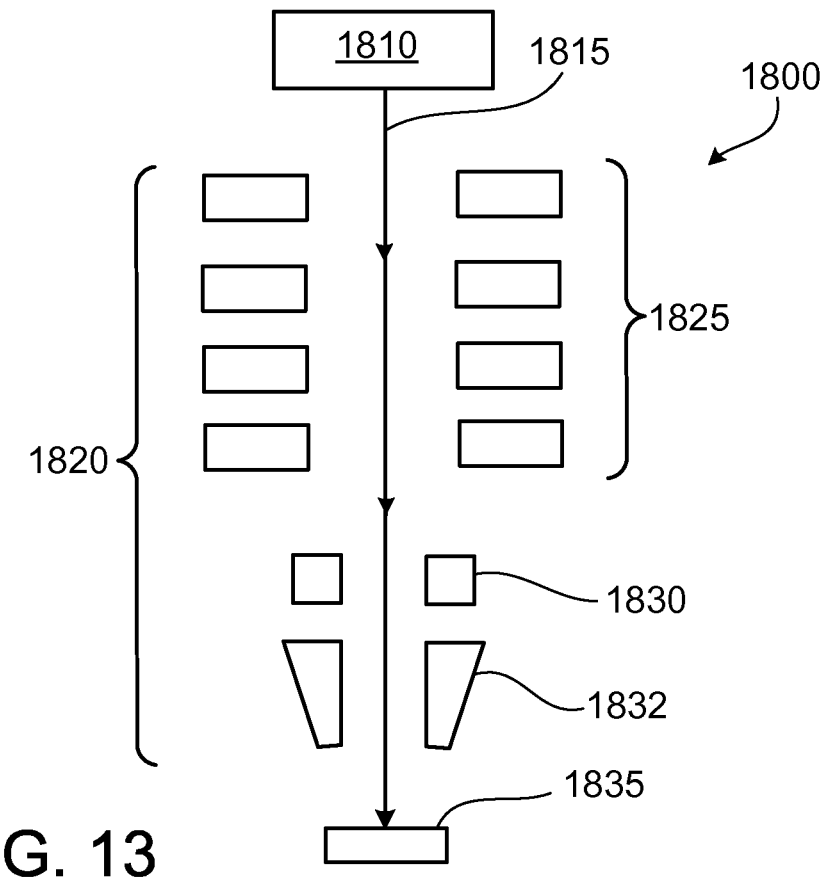
FIG. 13 is a schematic diagram of a static accelerator.

Static and/or dynamic accelerators of various types can also generally be used to accelerate ions. Static accelerators typically include a plurality of electrostatic lenses that are maintained at different DC voltages. By selecting appropriate values of the voltages applied to each of the lens elements, ions introduced into the accelerator can be accelerated to a selected final energy. FIG. 13 shows a simplified schematic diagram of a static accelerator 1800 that is configured to accelerate ions to treat cellulosic or lignocellulosic material 1835. Accelerator 1800 includes an ion source 1810 that produces ions and introduces the ions into an ion column 1820. Ion column 1820 includes a plurality of electrostatic lenses 1825 that accelerate the ions generated by ion source 1810 to produce an ion beam 1815. DC voltages are applied to lenses 1825; the potentials of the lenses remain approximately constant during operation. Generally, the electrical potential within each lens is constant, and the ions of ion beam 1815 are accelerated in the gaps between the various lenses 1825. Ion column 1820 also includes a deflection lens 1830 and a collimation lens 1832. These two lenses operate to direct ion beam 1815 to a selected position on cellulosic or lignocellulosic material 1835, and to focus ion beam 1815 onto the cellulosic or lignocellulosic material.

Although FIG. 13 shows a particular embodiment of a static accelerator, many other variations are possible and suitable for treating cellulosic or lignocellulosic material. In some embodiments, for example, the relative positions of deflection lens 1830 and collimation lens 1832 along ion column 1820 can be exchanged. Additional electrostatic lenses can also be present in ion column 1820, and ion column 1820 can further include magnetostatic optical elements. In certain embodiments, a wide variety of additional elements can be present in ion column 1820, including deflectors (e.g., quadrupole, hexapole, and/or octopole deflectors), filtering elements such as apertures to remove undesired species (e.g., neutrals and/or certain ionic species) from ion beam 1815, extractors (e.g., to establish a spatial profile for ion beam 1815), and other electrostatic and/or magnetostatic elements.

Dynamic linear accelerators—often referred to as LINACS—can also be used to generate an ion beam that can be used to treat cellulosic or lignocellulosic material. Typically, dynamic linear accelerators include an ion column with a linear series of radiofrequency cavities, each of which produces an intense, oscillating radiofrequency (RF) field that is timed to coincide with injection and propagation of ions into the ion column. As an example, devices such as klystrons can be used to generated the RF fields in the cavities. By matching the field oscillations to the injection times of ions, the RF cavities can accelerate ions to high energies without having to maintain peak potentials for long periods of time. As a result, LINACS typically do not have the same shielding requirements as DC accelerators, and are typically shorter in length. LINACS typically operate at frequencies of 3 GHz (S-band, typically limited to relatively low power) and 1 GHz (L-band, capable of significantly higher power operation). Typical LINACS have an overall length of 2-4 meters.

Figure 14:
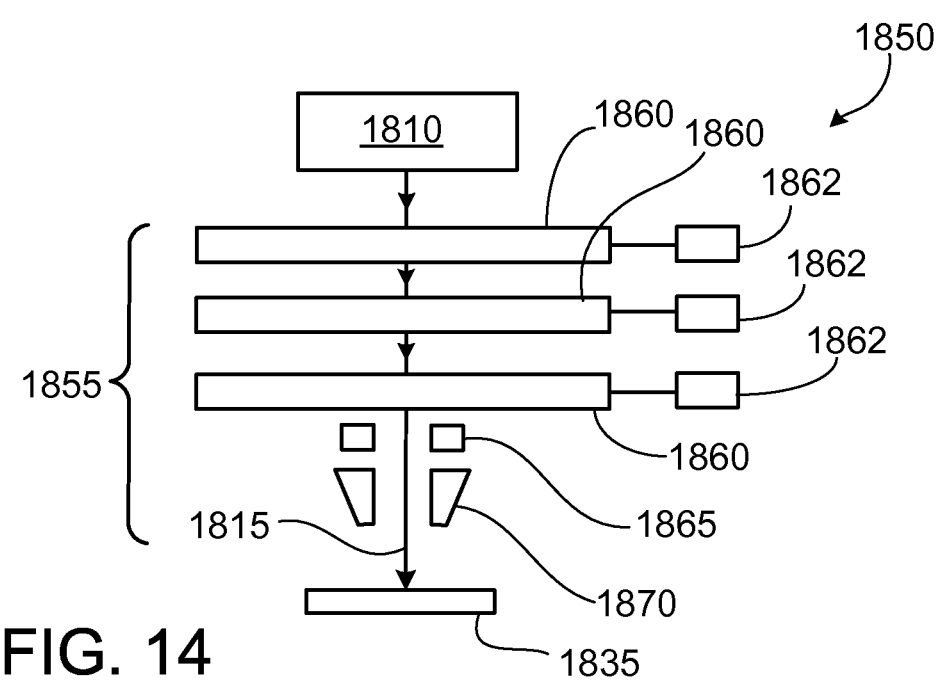
FIG. 14 is a schematic diagram of a dynamic linear accelerator.

A schematic diagram of a dynamic linear accelerator 1850 (e.g., a LINAC) is shown in FIG. 14. LINAC 1850 includes an ion source 1810 and an ion column 1855 that includes three acceleration cavities 1860, a deflector 1865, and a focusing lens 1870. Deflector 1865 and focusing lens 1870 function to steer and focus ion beam 1815 onto cellulosic or lignocellulosic material 1835 following acceleration, as discussed above. Acceleration cavities 1860 are formed of a conductive material such as copper, and function as a waveguide for the accelerated ions. Klystrons 1862, connected to each of cavities 1860, generate the dynamic RF fields that accelerate the ions within the cavities. Klystrons 1862 are individually configured to produce RF fields that, together, accelerate the ions in ion beam 1815 to a final, selected energy prior to being incident on cellulosic or lignocellulosic material 1835.

As discussed above in connection with static accelerators, many variations of dynamic accelerator 1850 are possible and can be used to produce an ion beam for treating cellulosic or lignocellulosic material. For example, in some embodiments, additional electrostatic lenses can also be present in ion column 1855, and ion column 1855 can further include magnetostatic optical elements. In certain embodiments, a wide variety of additional elements can be present in ion column 1855, including deflectors (e.g., quadrupole, hexapole, and/or octopole deflectors), filtering elements such as apertures to remove undesired species (e.g., neutrals and/or certain ionic species) from ion beam 1815, extractors (e.g., to establish a spatial profile for ion beam 1815), and other electrostatic and/or magnetostatic elements. In addition to the specific static and dynamic accelerators discussed above, other suitable accelerator systems include, for example: DC insulated core transformer (ICT) type systems, available from Nissin High Voltage, Japan; S-band LINACS, available from L3-PSD (USA), Linac Systems (France), Mevex (Canada), and Mitsubishi Heavy Industries (Japan); L-band LINACS, available from Iotron Industries (Canada); and ILU-based accelerators, available from Budker Laboratories (Russia).

Figure 15:
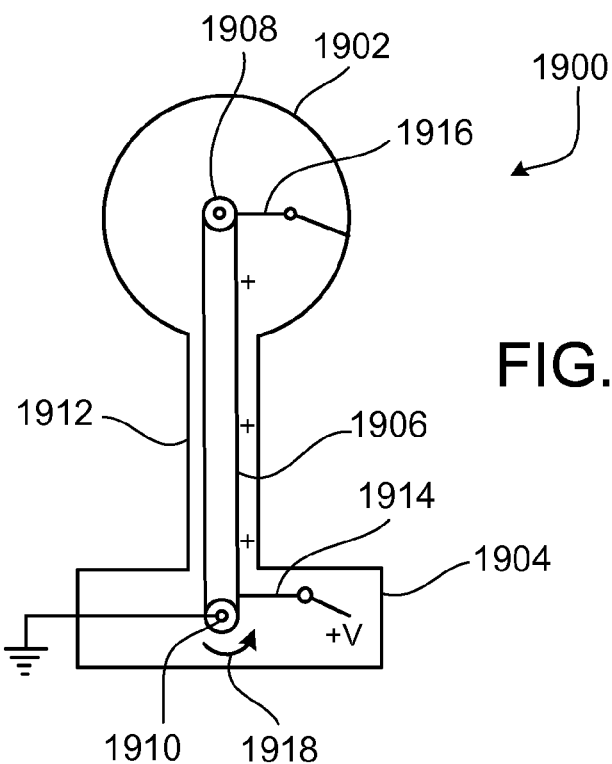
FIG. 15 is a schematic diagram of a van de Graaff accelerator.

In some embodiments, van de Graaff-based accelerators can be used to produce and/or accelerate ions for subsequent treatment of cellulosic or lignocellulosic material. FIG. 15 shows an embodiment of a van de Graaff accelerator 1900 that includes a spherical shell electrode 1902 and an insulating belt 1906 that recirculates between electrode 1902 and a base 1904 of accelerator 1900. During operation, insulating belt 1906 travels over pulleys 1910 and 1908 in the direction shown by arrow 1918, and carries charge into electrode 1902. Charge is removed from belt 1906 and transferred to electrode 1902, so that the magnitude of the electrical potential on electrode 1902 increases until electrode 1902 is discharged by a spark (or, alternatively, until the charging current is balanced by a load current).

Pulley 1910 is grounded, as shown in FIG. 15. A corona discharge is maintained between a series of points or a fine wire on one side of belt 1906. Wire 1914 is configured to maintain the corona discharge in accelerator 1900. Wire 1914 is maintained at a positive potential, so that belt 1906 intercepts positive ions moving from wire 1914 to pulley 1910. As belt 1906 moves in the direction of arrow 1918, the intercepted charges are carried into electrode 1902, where they are removed from belt 1906 by a needle point 1916 and transferred to electrode 1902. As a result, positive charges accumulate on the surface of electrode 1902; these charges can be discharged from the surface of electrode 1902 and used to treat cellulosic or lignocellulosic material. In some embodiments, accelerator 1900 can be configured to provide negatively charged ions by operating wire 1914 and needle point 1916 at a negative potential with respect to grounded pulley 1910.

In general, accelerator 1900 can be configured to provide a wide variety of different types of positive and negative charges for treating cellulosic or lignocellulosic material. Exemplary types of charges include electrons, protons, hydrogen ions, carbon ions, oxygen ions, halogen ions, metal ions, and other types of ions.

Figure 16:
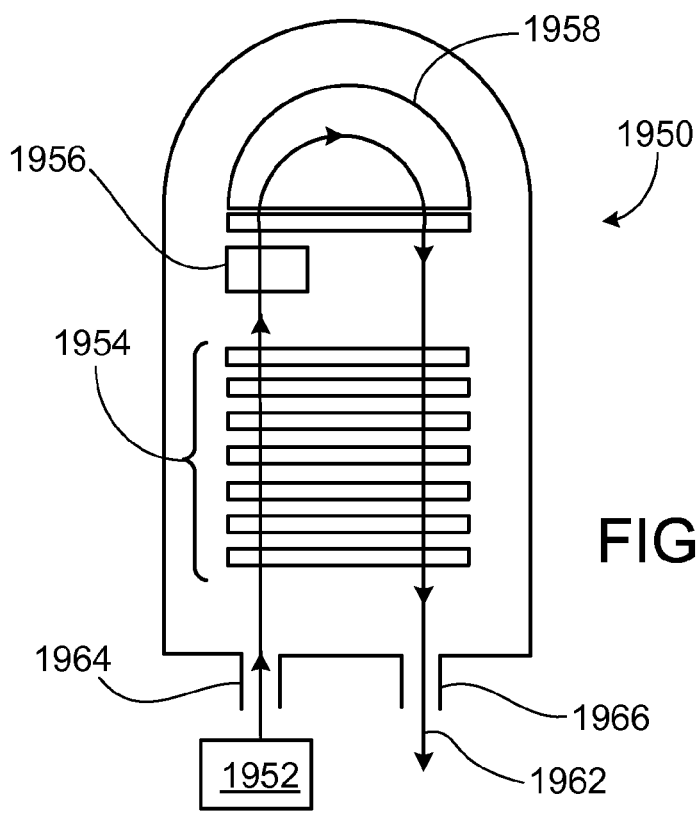
FIG. 16 is a schematic diagram of a folded tandem accelerator.

In certain embodiments, tandem accelerators (including folded tandem accelerators) can be used to generate ion beams for treatment of cellulosic or lignocellulosic material. An example of a folded tandem accelerator 1950 is shown in FIG. 16. Accelerator 1950 includes an accelerating column 1954, a charge stripper 1956, a beam deflector 1958, and an ion source 1952.

During operation, ion source 1952 produces a beam 1960 of negatively charged ions, which is directed to enter accelerator 1950 through input port 1964. In general, ion source 1952 can be any type of ion source that produces negatively charged ions. For example, suitable ion sources include a source of negative ions by cesium sputtering (SNICS) source, a RF-charge exchange ion source, or a toroidal volume ion source (TORVIS). Each of the foregoing exemplary ion sources is available, for example, from National Electrostatics Corporation (Middleton, Wis.).

Once inside accelerator 1950, the negative ions in beam 1960 are accelerated by accelerating column 1954. Typically, accelerating column 1954 includes a plurality of accelerating elements such as electrostatic lenses. The potential difference applied in column 1954 to accelerate the negative ions can be generated using various types of devices. For example, in some embodiments, (e.g., Pelletron® accelerators), the potential is generated using a Pelletron® charging device. Pelletron® devices include a charge-carrying belt that is formed from a plurality of metal (e.g., steel) chain links or pellets that are bridged by insulating connectors (e.g., formed from a material such as nylon). During operation, the belt recirculates between a pair of pulleys, one of which is maintained at ground potential. As the belt moves between the grounded pulley and the opposite pulley (e.g., the terminal pulley), the metal pellets are positively charged by induction. Upon reaching the terminal pulley, the positive charge that has accumulated on the belt is removed, and the pellets are negatively charged as they leave the terminal pulley and return to the ground pulley.

The Pelletron® device generates a large positive potential within column 1954 that is used to accelerate the negative ions of beam 1960. After undergoing acceleration in column 1954, beam 1960 passes through charge stripper 1956. Charge stripper 1956 can be implemented as a thin metal foil and/or a tube containing a gas that strips electrons from the negative ions, for example. The negatively charged ions are thereby converted to positively charged ions, which emerge from charge stripper 1956. The trajectories of the emerging positively charged ions are altered so that the positively charged ions travel back through accelerating column 1954, undergoing a second acceleration in the column before emerging as positively charged ion beam 1962 from output port 1966. Positively charged ion beam 1962 can then be used to treat cellulosic or lignocellulosic material according to the various methods disclosed herein.

Due to the folded geometry of accelerator 1950, ions are accelerated to a kinetic energy that corresponds to twice the potential difference generated by the Pelletron® charging device. For example, in a 2 MV Pelletron® accelerator, hydride ions that are introduced by ion source 1952 will be accelerated to an intermediate energy of 2 MeV during the first pass through column 1954, converted to positive ions (e.g., protons), and accelerated to a final energy of 4 MeV during the second pass through column 1954.

In certain embodiments, column 1954 can include elements in addition to, or as alternatives to, the Pelletron® charging device. For example, column 1954 can include static accelerating elements (e.g., DC electrodes) and/or dynamic acceleration cavities (e.g., LINAC-type cavities with pulse RF field generators for particle acceleration).

Potentials applied to the various accelerating devices are selected to accelerate the negatively charged ions of beam 1960.

Exemplary tandem accelerators, including both folded and non-folded accelerators, are available from National Electrostatics Corporation (Middleton, Wis.), for example.

In some embodiments, combinations of two or more of the various types of accelerators can be used to produce ion beams that are suitable for treating cellulosic or lignocellulosic material. For example, a folded tandem accelerator can be used in combination with a linear accelerator, a Rhodotron® accelerator, a Dynamitron®, a static accelerator, or any other type of accelerator to produce ion beams. Accelerators can be used in series, with the output ion beam from one type of accelerator directed to enter another type of accelerator for additional acceleration. Alternatively, multiple accelerators can be used in parallel to generate multiple ion beams. In certain embodiments, multiple accelerators of the same type can be used in parallel and/or in series to generate accelerated ion beams.

In some embodiments, multiple similar and/or different accelerators can be used to generate ion beams having different compositions. For example, a first accelerator can be used to generate one type of ion beam, while a second accelerator can be used to generate a second type of ion beam. The two ion beams can then each be further accelerated in another accelerator, or can be used to treat cellulosic or lignocellulosic material.

Further, in certain embodiments, a single accelerator can be used to generate multiple ion beams for treating cellulosic or lignocellulosic material. For example, any of the accelerators discussed herein (and other types of accelerators as well) can be modified to produce multiple output ion beams by sub-dividing an initial ion current introduced into the accelerator from an ion source. Alternatively, or in addition, any one ion beam produced by any of the accelerators disclosed herein can include only a single type of ion, or multiple different types of ions.

In general, where multiple different accelerators are used to produce one or more ion beams for treatment of cellulosic or lignocellulosic material, the multiple different accelerators can be positioned in any order with respect to one another. This provides for great flexibility in producing one or more ion beams, each of which has carefully selected properties for treating cellulosic or lignocellulosic material (e.g., for treating different components in cellulosic or lignocellulosic material).

The ion accelerators disclosed herein can also be used in combination with any of the other treatment steps disclosed herein. For example, in some embodiments, electrons and ions can be used in combination to treat cellulosic or lignocellulosic material. The electrons and ions can be produced and/or accelerated separately, and used to treat cellulosic or lignocellulosic material sequentially (in any order) and/or simultaneously. In certain embodiments, electron and ion beams can be produced in a common accelerator and used to treat cellulosic or lignocellulosic material. For example, many of the ion accelerators disclosed herein can be configured to produce electron beams as an alternative to, or in addition to, ion beams. For example, Dynamitron® accelerators, Rhodotron® accelerators, and LINACs can be configured to produce electron beams for treatment of cellulosic or lignocellulosic material.

Moreover, treatment of cellulosic or lignocellulosic material with ion beams can be combined with other techniques such as sonication. In general, sonication-based treatment can occur before, during, or after ion-based treatment. Other treatments such as electron beam treatment can also occur in any combination and/or order with ultrasonic treatment and ion beam treatment.

Process Water

In the processes disclosed herein, whenever water is used in any process, it may be grey water, e.g., municipal grey water, or black water. In some embodiments, the grey or black water is sterilized prior to use. Sterilization may be accomplished by any desired technique, for example by irradiation, steam, or chemical sterilization.

EXAMPLES

The following examples are not limiting to the inventions claimed herein.

Example 1

Methods of Determining Molecular Weight of Cellulosic and Lignocellulosic Materials by Gel Permeation Chromatography This example illustrates how molecular weight is determined for the materials discussed herein. Cellulosic and lignocellulosic materials for analysis were treated as follows:

A 1500 pound skid of virgin bleached white Kraft board having a bulk density of 30 lb/ft$^3$ was obtained from International Paper. The material was folded flat, and then fed into a 3 hp Flinch Baugh shredder at a rate of approximately 15 to 20 pounds per hour. The shredder was equipped with two 12 inch rotary blades, two fixed blades and a 0.30 inch discharge screen. The gap between the rotary and fixed blades was adjusted to 0.10 inch. The output from the shredder resembled confetti (as above). The confetti-like material was fed to a Munson rotary knife cutter, Model SC30. The discharge screen had ⅛ inch openings. The gap between the rotary and fixed blades was set to approximately 0.020 inch. The rotary knife cutter sheared the confetti-like pieces across the knife-edges. The material resulting from the first shearing was fed back into the same setup and the screen was replaced with a ¹⁄₁₆ inch screen. This material was sheared. The material resulting from the second shearing was fed back into the same setup and the screen was replaced with a ¹⁄₃₂ inch screen. This material was sheared. The resulting fibrous material had a BET surface area of 1.6897 m$^2$/g+/−0.0155 m$^2$/g, a porosity of 87.7163 percent and a bulk density (@0.53 psia) of 0.1448 g/mL. An average length of the fibers was 0.824 mm and an average width of the fibers was 0.0262 mm, giving an average L/D of 32:1.

Sample materials presented in the following Tables 1 and 2 include Kraft paper (P), wheat straw (WS), alfalfa (A), and switchgrass (SG). The number "132" of the Sample ID refers to the particle size of the material after shearing through a ¹⁄₃₂ inch screen. The number after the dash refers to the dosage of radiation (MRad) and "US" refers to ultrasonic treatment. For example, a sample ID "P132-10" refers to Kraft paper that has been sheared to a particle size of 132 mesh and has been irradiated with 10 MRad.

TABLE 1

Peak Average Molecular Weight of Irradiated Kraft Paper

| Sample Source | Sample ID | Dosage[1] (MRad) | Ultrasound[2] | Average MW ± Std Dev. |
|---|---|---|---|---|
| Kraft Paper | P132 | 0 | No | 32853 ± 10006 |
| | P132-10 | 10 | " | 61398 ± 2468** |
| | P132-100 | 100 | " | 8444 ± 580 |
| | P132-181 | 181 | " | 6668 ± 77 |
| | P132-US | 0 | Yes | 3095 ± 1013 |

**Low doses of radiation appear to increase the molecular weight of some materials
[1]Dosage Rate = 1 MRad/hour
[2]Treatment for 30 minutes with 20 kHz ultrasound using a 1000 W horn under re-circulating conditions with the material dispersed in water.

TABLE 2

Peak Average Molecular Weight of Irradiated Materials

| Sample ID | Peak # | Dosage[1] (MRad) | Ultrasound[2] | Average MW ± Std Dev. |
|---|---|---|---|---|
| WS132 | 1 | 0 | No | 1407411 ± 175191 |
| | 2 | " | " | 39145 ± 3425 |
| | 3 | " | " | 2886 ± 177 |
| WS132-10* | 1 | 10 | " | 26040 ± 3240 |
| WS132-100* | 1 | 100 | " | 23620 ± 453 |
| A132 | 1 | 0 | " | 1604886 ± 151701 |
| | 2 | " | " | 37525 ± 3751 |
| | 3 | " | " | 2853 ± 490 |
| A132-10* | 1 | 10 | " | 50853 ± 1665 |
| | 2 | " | " | 2461 ± 17 |
| A132-100* | 1 | 100 | " | 38291 ± 2235 |
| | 2 | " | " | 2487 ± 15 |
| SG132 | 1 | 0 | " | 1557360 ± 83693 |
| | 2 | " | " | 42594 ± 4414 |
| | 3 | " | " | 3268 ± 249 |
| SG132-10* | 1 | 10 | " | 60888 ± 9131 |
| SG132-100* | 1 | 100 | " | 22345 ± 3797 |
| SG132-10-US | 1 | 10 | Yes | 86086 ± 43518 |
| | 2 | " | " | 2247 ± 468 |
| SG132-100-US | 1 | 100 | " | 4696 ± 1465 |

*Peaks coalesce after treatment
**Low doses of radiation appear to increase the molecular weight of some materials
[1]Dosage Rate = 1 MRad/hour
[2]Treatment for 30 minutes with 20 kHz ultrasound using a 1000 W horn under re-circulating conditions with the material dispersed in water Gel Permeation Chromatography (GPC) is used to determine the molecular weight distribution of polymers. During GPC analysis, a solution of the polymer sample is passed through a column packed with a porous gel trapping small molecules. The sample is separated based on molecular size with larger molecules eluting sooner than smaller molecules. The retention time of each component is most often detected by refractive index (RI), evaporative light scattering (ELS), or ultraviolet (UV) and compared to a calibration curve. The resulting data is then used to calculate the molecular weight distribution for the sample.

A distribution of molecular weights rather than a unique molecular weight is used to characterize synthetic polymers. To characterize this distribution, statistical averages are utilized. The most common of these averages are the "number average molecular weight" ($M_n$) and the "weight average molecular weight" ($M_w$). Methods of calculating these values are described in the art, e.g., in Example 9 of WO 2008/073186.

$M_n$ is similar to the standard arithmetic mean associated with a group of numbers. When applied to polymers, $M_n$ refers to the average molecular weight of the molecules in the polymer. $M_n$ is calculated affording the same amount of significance to each molecule regardless of its individual molecular weight. The average $M_n$ is calculated by the following formula where $N_i$ is the number of molecules with a molar mass equal to $M_i$.

$$\overline{M}_n = \frac{\sum_i N_i M_i}{\sum_i N_i}$$

$M_w$ is another statistical descriptor of the molecular weight distribution that places a greater emphasis on larger molecules than smaller molecules in the distribution. The formula below shows the statistical calculation of the weight average molecular weight.

$$\overline{M}_w = \frac{\sum_i N_i M_i^2}{\sum_i N_i M_i}$$

The polydispersity index or PI is defined as the ratio of $M_w/M_n$. The larger the PI, the broader or more disperse the distribution. The lowest value that a PI can be is 1. This represents a monodisperse sample; that is, a polymer with all of the molecules in the distribution being the same molecular weight.

The peak molecular weight value ($M_P$) is another descriptor defined as the mode of the molecular weight distribution. It signifies the molecular weight that is most abundant in the distribution. This value also gives insight to the molecular weight distribution.

Most GPC measurements are made relative to a different polymer standard. The accuracy of the results depends on how closely the characteristics of the polymer being analyzed match those of the standard used. The expected error in reproducibility between different series of determinations, calibrated separately, is ca. 5-10% and is characteristic to the limited precision of GPC determinations. Therefore, GPC results are most useful when a comparison between the molecular weight distribution of different samples is made during the same series of determinations.

The lignocellulosic samples required sample preparation prior to GPC analysis. First, a saturated solution (8.4% by weight) of lithium chloride (LiCl) was prepared in dimethyl acetamide (DMAc). Approximately 100 mg of each sample was added to approximately 10 g of a freshly prepared saturated LiCl/DMAc solution, and the mixture was heated to approximately 150° C.-170° C. with stirring for 1 hour. The resulting solutions were generally light- to dark-yellow in color. The temperature of the solutions was decreased to approximately 100° C. and the solutions were heated for an additional 2 hours. The temperature of the solutions was then decreased to approximately 50° C. and the sample solutions were heated for approximately 48 to 60 hours. Of note, samples irradiated at 100 MRad were more easily solubilized as compared to their untreated counterpart. Additionally, the sheared samples (denoted by the number 132) had slightly lower average molecular weights as compared with uncut samples.

The resulting sample solutions were diluted 1:1 using DMAc as solvent and were filtered through a 0.45 μm PTFE filter. The filtered sample solutions were then analyzed by GPC. The peak average molecular weights (Mp) of the samples, as determined by Gel Permeation Chromatography (GPC), are summarized in Tables 1 and 2. Each sample was prepared in duplicate and each preparation of the sample was analyzed in duplicate (two injections) for a total of four injections per sample. The EasiCal® polystyrene standards PS1A and PS1B were used to generate a calibration curve for the molecular weight scale from about 580 to 7,500,00 Daltons. The GPC analysis conditions are recited in Table 3 below.

TABLE 3

GPC Analysis Conditions

| | |
|---|---|
| Instrument: | Waters Alliance GPC 2000 |
| Columns (3): | Plgel 10μ Mixed-B |
| | S/N's: 10M-MB-148-83; |
| | 10M-MB-148-84; 10M-MB-174-129 |
| Mobile Phase (solvent): | 0.5% LiCl in DMAc (1.0 mL/min.) |
| Column/Detector Temperature: | 70° C. |
| Injector Temperature: | 70° C. |
| Sample Loop Size: | 323.5 μL |

Example 2

Electron Beam Processing Textile Samples

Cellulosic yarn samples are treated with a beam of electrons using a vaulted Rhodotron® TT200 continuous wave accelerator delivering 5 MeV electrons at 80 kW output power. Table 4 describes the nominal parameters for the TT200. Table 5 describes the nominal doses (in MRad) and actual doses (in kgy) that are delivered to the samples.

TABLE 4

Rhodotron ® TT 200 Parameters

| Beam | |
|---|---|
| Beam Produced: | Accelerated electrons |
| Beam energy: | Nominal (maximum): 10 MeV (+0 keV-250 keV |
| Energy dispersion at 10 Mev: | Full width half maximum (FWHM) 300 keV |
| Beam power at 10 MeV: | Guaranteed Operating Range 1 to 80 kW |
| Power Consumption | . |
| Stand-by condition (vacuum and cooling ON): | <15 kW |
| At 50 kW beam power: | <210 kW |
| At 80 kW beam power: | <260 kW |
| RF System | |
| Frequency: | 107.5 ± 1 MHz |
| Tetrode type: | Thomson TH781 |
| Scanning Horn | |
| Nominal Scanning Length (measured at 25-35 cm from window): | 120 cm |
| Scanning Range: | From 30% to 100% of Nominal Scanning Length |
| Nominal Scanning Frequency (at max. Scanning length): | 100 Hz ± 5% |
| Scanning Uniformity (across 90% of Nominal Scanning Length) | ±5% |

TABLE 5

Dosages Delivered to Samples

| Total Dosage (MRad) (Number Associated with Sample ID | Delivered Dose (kgy)[1] |
|---|---|
| 0.1 | 0.99 |
| 1 | 9.9 |
| 3 | 29.0 |
| 5 | 50.4 |
| 7 | 69.2 |

[1]For example, 9.9 kgy is delivered in 11 seconds at a beam current of 5 mA and a line speed of 12.9 feet/minute. Cool time between 1 MRad treatments is about 2 minutes.

Other Embodiments

It is to be understood that while the invention has been described in conjunction with the detailed description thereof, the foregoing description is intended to illustrate and not limit the scope of the invention, which is defined by the scope of the appended claims.

For example, in some embodiments a high dose of very low energy radiation may be applied to a textile having a sizing or other coating that is to be removed. The penetration depth of the radiation is selected so that only the coating is irradiated. The dose is selected so that the radiation will partly or fully break down the coating, e.g., to allow the coating to be rinsed off of or otherwise removed from the textile. Electron beam radiation is generally preferred for this process, as penetration depth can be readily and accurately controlled. Suitable equipment for performing this method is commercially available, e.g., the Compact High Voltage Systems available from Energy Sciences, Inc.

Other aspects, advantages, and modifications are within the scope of the following claims.

What is claimed is:

1. A method of treating a textile, the method comprising: irradiating a textile comprising a fibrous cellulosic material;
quenching the irradiated textile by applying pressure to the textile by mechanically compressing the textile in at least two dimensions at a pressure of at least 1000 psi, together with a sufficient quantity of beat to elevate the temperature of the textile to above a melting point or softening point of a component of the textile; and
irradiating the quenched textile a second time with a second dose of ionizing radiation;
wherein the fibrous cellulosic material has an alpha-cellulose content of less than about 80 percent, is selected from the group consisting of flax, hemp, jute, abaca, sisal, wheat straw, lignocellulose filler (LF), ramie, bamboo fibers, cuprammonium cellulose, regenerated wood cellulose, lyocell, cellulose acetate, and blends thereof, and is spun, woven, knitted or entangled.

2. The method of claim 1, where each dose of ionizing radiation is at least 0.10 Mrad of ionizing electron beam radiation.

3. The method of claim 2, where each dose of ionizing radiation is from 0.25 to 2.5 Mrad.

4. The method of claim 1, wherein quenching further comprises quenching in the presence of a gas selected to react with radicals present, in the irradiated textile.

5. The method of claim 1, further comprising quenching the irradiated textile a second time.

6. The method of claim 4, wherein the gas is selected from the group consisting of: nitrogen, oxygen, acetylene, acetylene in nitrogen, ethylene, chlorinated ethylenes, propylene, or mixture thereof.

7. The method of claim 4, wherein irradiating followed by quenching provides the material with functional groups.

8. The method of claim 7, wherein the functional groups comprise one or more of: aldehyde groups, enol groups, nitroso groups, nitrile groups, nitro groups, ketone groups, amino groups, alkyl amino groups, alkyl groups, chloroalkyl groups, chlorofluoroalkyl groups, and/or carboxylic acid groups.

9. The method of claim 1, wherein after quenching, the radicals are at a level not detectable with an electron spin resonance spectrometer.

10. The method of claim 1, further comprising dying, sizing or coating the textile.

11. The method of claim 1, wherein quenching is conducted under conditions that alter the charge density of the textile, and the method further comprises using the textile to make a filter.

12. The method claim 1, wherein the resulting textile has one or more of: increased moisture regain, work recovery, and decomposition temperature.

13. The method of claim 2 wherein electrons in the electron beam have an energy of at least 0.25 MeV.

14. The method of claim 13 wherein electrons in the electron beam have an energy of between 0.25 MeV and 7.2 MeV.

\* \* \* \* \*